(12) United States Patent
Ryu et al.

(10) Patent No.: US 11,841,495 B2
(45) Date of Patent: Dec. 12, 2023

(54) METHOD FOR DETECTING PARTICLES USING STRUCTURED ILLUMINATION

(71) Applicant: Rebus Biosystems, Inc., Santa Clara, CA (US)

(72) Inventors: Jekwan Ryu, Cupertino, CA (US); Hojin Lee, Santa Clara, CA (US); Ahreum Oh, San Jose, CA (US)

(73) Assignee: REBUS BIOSYSTEMS, INC., Santa Clara, CA (US)

( * ) Notice: Subject to any disclaimer, the term of this patent is extended or adjusted under 35 U.S.C. 154(b) by 30 days.

(21) Appl. No.: 17/741,240

(22) Filed: May 10, 2022

(65) Prior Publication Data

US 2022/0334368 A1    Oct. 20, 2022

Related U.S. Application Data

(63) Continuation of application No. 16/262,429, filed on Jan. 30, 2019, now Pat. No. 11,366,303.
(Continued)

(51) Int. Cl.
*G02B 21/36*    (2006.01)
*G02B 21/06*    (2006.01)
(Continued)

(52) U.S. Cl.
CPC ........... *G02B 21/367* (2013.01); *G02B 21/06* (2013.01); *G02B 21/08* (2013.01); *G02B 21/365* (2013.01);
(Continued)

(58) Field of Classification Search
CPC ...... G02B 21/367; G02B 21/06; G02B 21/18; G02B 21/365; G02B 27/58; G02B 21/14; G02B 21/0056; G02B 21/0076; G02B 21/008; G02B 21/361; G03F 7/70408; G06T 7/0012; G06T 2207/10056;
(Continued)

(56) References Cited

U.S. PATENT DOCUMENTS 3,780,217 A    12/1973    Sawatari
3,785,262 A    1/1974    Stroke
(Continued)

FOREIGN PATENT DOCUMENTS

CN    101790584 A    7/2010
CN    101790585 A    7/2010
(Continued)

OTHER PUBLICATIONS

Myung Kim. Principles and techniques of digital holographic microscopy. SPIE Reviews 018005-1 vol. 1, 2010. (Year: 2010).*
(Continued)

*Primary Examiner* — Collin X Beatty
(74) *Attorney, Agent, or Firm* — FENWICK & WEST LLP

(57) ABSTRACT

A particle detection method detects presence and location of particles on a target using measured signals from a plurality of structured illumination patterns. The particle detection method uses measured signals obtained by illuminating the target with structured illumination patterns to detect particles. Specifically, the degree of variation in these measured signals in raw images is calculated to determine whether a particle is present on the target at a particular area of interest.

20 Claims, 15 Drawing Sheets

Related U.S. Application Data

(60) Provisional application No. 62/624,071, filed on Jan. 30, 2018.

(51) Int. Cl.

| | | |
|---|---|---|
| *G02B 21/18* | (2006.01) | |
| *G02B 27/58* | (2006.01) | |
| *G06T 7/00* | (2017.01) | |
| *G03F 7/00* | (2006.01) | |
| *G06V 10/60* | (2022.01) | |
| *G06V 10/145* | (2022.01) | |
| *G06V 20/69* | (2022.01) | |
| *G02B 21/08* | (2006.01) | |

(52) U.S. Cl.
CPC ......... *G02B 27/58* (2013.01); *G03F 7/70408* (2013.01); *G06T 7/0012* (2013.01); *G06V 10/145* (2022.01); *G06V 10/60* (2022.01); *G06V 20/695* (2022.01); *G06T 2207/10056* (2013.01); *G06T 2207/30072* (2013.01)

(58) Field of Classification Search
CPC . G06T 2207/30072; G06T 2207/10152; G06T 2207/30024; G06V 10/145; G06V 10/60; G06V 20/695; G06V 2201/04
See application file for complete search history.

(56) References Cited

U.S. PATENT DOCUMENTS

| | | | |
|---|---|---|---|
| 4,890,921 A | 1/1990 | Pond et al. | |
| 5,041,733 A | 8/1991 | Noguchi et al. | |
| 5,086,341 A | 2/1992 | Tamada et al. | |
| 5,341,312 A | 8/1994 | Lisson et al. | |
| 5,406,412 A | 4/1995 | Zehnpfennig et al. | |
| 5,470,710 A | 11/1995 | Weiss et al. | |
| 5,511,060 A | 4/1996 | Jiu et al. | |
| 5,674,698 A | 10/1997 | Zarling et al. | |
| 5,695,934 A | 12/1997 | Brenner | |
| 5,750,341 A | 5/1998 | Macevicz | |
| 5,751,243 A | 5/1998 | Turpin | |
| 5,763,175 A | 6/1998 | Brenner | |
| 5,780,231 A | 7/1998 | Brenner | |
| 5,902,723 A | 5/1999 | Dower et al. | |
| 5,969,119 A | 10/1999 | Macevicz | |
| 6,013,445 A | 1/2000 | Albrecht et al. | |
| 6,016,196 A * | 1/2000 | Mermelstein | G02B 21/14 356/477 |
| 6,140,660 A * | 10/2000 | Mermelstein | G03F 7/70408 359/9 |
| 6,306,597 B1 | 10/2001 | Macevicz | |
| 6,406,848 B1 | 6/2002 | Bridgham et al. | |
| 6,525,875 B1 | 2/2003 | Lauer | |
| 6,534,266 B1 | 3/2003 | Singer | |
| 6,539,805 B2 | 4/2003 | Heaslip et al. | |
| 6,548,820 B1 | 4/2003 | Mermelstein | |
| 6,654,505 B2 | 11/2003 | Bridgham et al. | |
| 6,787,308 B2 | 9/2004 | Balasubramanian et al. | |
| 6,806,052 B2 | 10/2004 | Bridgham et al. | |
| 6,831,994 B2 | 12/2004 | Bridgham et al. | |
| 6,833,246 B2 | 12/2004 | Balasubramanian | |
| 6,911,345 B2 | 6/2005 | Quake et al. | |
| 6,969,488 B2 | 11/2005 | Bridgham et al. | |
| 7,115,400 B1 | 10/2006 | Adessi et al. | |
| 7,122,384 B2 | 10/2006 | Prober et al. | |
| 7,169,560 B2 | 1/2007 | Lapidus et al. | |
| 7,211,390 B2 | 5/2007 | Rothberg et al. | |
| 7,248,338 B2 | 7/2007 | Fukuda | |
| 7,397,018 B1 | 7/2008 | Pham et al. | |
| 7,405,114 B2 | 7/2008 | Oishi | |
| 7,602,501 B2 | 10/2009 | Ralston et al. | |
| 7,639,909 B2 | 12/2009 | Murshid et al. | |
| 7,643,155 B2 | 1/2010 | Marks et al. | |
| 7,916,144 B2 | 3/2011 | Schiwietz et al. | |
| 8,222,040 B2 | 7/2012 | Hong et al. | |
| 8,329,560 B2 | 12/2012 | Lee et al. | |
| 8,502,867 B2 | 8/2013 | Park | |
| 8,759,077 B2 | 6/2014 | Hong et al. | |
| 8,821,799 B2 | 9/2014 | Bassler et al. | |
| 8,929,630 B2 | 1/2015 | Fu | |
| 9,465,228 B2 | 10/2016 | Lee et al. | |
| 9,772,505 B2 | 9/2017 | Lee et al. | |
| 10,187,626 B2 | 1/2019 | Shechtman et al. | |
| 10,718,934 B2 * | 7/2020 | Horstmeyer | G02B 21/0092 |
| 10,754,140 B2 * | 8/2020 | Chan | G02B 21/02 |
| 2002/0051992 A1 | 5/2002 | Bridgham et al. | |
| 2002/0061529 A1 | 5/2002 | Bridgham et al. | |
| 2002/0074495 A1 | 6/2002 | Notte | |
| 2002/0137052 A1 | 9/2002 | Bridgham et al. | |
| 2003/0077615 A1 | 4/2003 | Bridgham et al. | |
| 2003/0219150 A1 * | 11/2003 | Niles | G06T 7/74 382/128 |
| 2003/0224419 A1 | 12/2003 | Corcoran et al. | |
| 2005/0099682 A1 | 5/2005 | Lauer | |
| 2005/0100932 A1 | 5/2005 | Lapidus et al. | |
| 2005/0176088 A1 | 8/2005 | Song et al. | |
| 2005/0221351 A1 | 10/2005 | Ryu | |
| 2005/0239113 A1 * | 10/2005 | Ryu | G01N 21/6452 702/20 |
| 2005/0239114 A1 | 10/2005 | Ryu et al. | |
| 2005/0239115 A1 | 10/2005 | Ryu et al. | |
| 2005/0286576 A1 | 12/2005 | Gill et al. | |
| 2006/0012784 A1 | 1/2006 | Ulmer | |
| 2006/0012793 A1 | 1/2006 | Harris | |
| 2006/0024711 A1 | 2/2006 | Lapidus et al. | |
| 2006/0051876 A1 | 3/2006 | Bridgham et al. | |
| 2006/0146334 A1 | 7/2006 | Cluff et al. | |
| 2006/0263777 A1 | 11/2006 | Tong | |
| 2006/0274408 A1 | 12/2006 | Laver | |
| 2007/0014486 A1 | 1/2007 | Schiwietz et al. | |
| 2007/0031875 A1 | 2/2007 | Buzby | |
| 2007/0070349 A1 | 3/2007 | Harris et al. | |
| 2007/0082562 A1 | 4/2007 | Van Der Lee et al. | |
| 2007/0087362 A1 | 4/2007 | Church et al. | |
| 2007/0099208 A1 | 5/2007 | Drmanac et al. | |
| 2007/0108284 A1 | 5/2007 | Pankow et al. | |
| 2007/0231825 A1 | 10/2007 | Banerjee et al. | |
| 2007/0273863 A1 | 11/2007 | Leep et al. | |
| 2008/0137080 A1 | 6/2008 | Bodzin et al. | |
| 2008/0140341 A1 | 6/2008 | Ralston et al. | |
| 2008/0176145 A1 | 7/2008 | Ohnuma | |
| 2008/0241936 A1 | 10/2008 | Banerjee et al. | |
| 2008/0315095 A1 | 12/2008 | Nakasuji et al. | |
| 2009/0061505 A1 * | 3/2009 | Hong | C12Q 1/6869 435/287.2 |
| 2009/0061526 A1 * | 3/2009 | Hong | C12Q 1/6869 382/129 |
| 2009/0244536 A1 | 10/2009 | Mitchell et al. | |
| 2009/0276188 A1 | 11/2009 | Cui et al. | |
| 2011/0141483 A1 | 6/2011 | Lee et al. | |
| 2011/0157599 A1 | 6/2011 | Weaver et al. | |
| 2011/0228068 A1 | 9/2011 | Park | |
| 2011/0228073 A1 * | 9/2011 | Lee | G02B 21/367 348/80 |
| 2011/0286100 A1 | 11/2011 | Wan et al. | |
| 2011/0311996 A1 | 12/2011 | Friedberger et al. | |
| 2012/0074225 A1 | 3/2012 | Moon et al. | |
| 2013/0280752 A1 * | 10/2013 | Ozcan | G01B 9/02041 356/482 |
| 2014/0323325 A1 * | 10/2014 | Beal | G02B 21/0096 435/5 |
| 2015/0036038 A1 * | 2/2015 | Horstmeyer | G02B 21/006 348/360 |
| 2016/0139392 A1 * | 5/2016 | Yamaguchi | G02B 21/0088 359/393 |
| 2016/0202163 A1 | 7/2016 | Weissleder et al. | |
| 2016/0341945 A1 * | 11/2016 | Ou | H04N 23/56 |
| 2017/0168285 A1 * | 6/2017 | Ozcan | G02B 21/0056 |
| 2017/0176338 A1 | 6/2017 | Wu et al. | |
| 2017/0307509 A1 * | 10/2017 | Boccara | G02B 21/14 |
| 2018/0136481 A1 | 5/2018 | Lee et al. | |

(56) References Cited

U.S. PATENT DOCUMENTS

| | | | |
|---|---|---|---|
| 2018/0246314 A1 | 8/2018 | Swager et al. | |
| 2019/0251330 A1 | 8/2019 | Cotte et al. | |
| 2021/0112187 A1* | 4/2021 | Chen .................. | G02B 21/08 |

FOREIGN PATENT DOCUMENTS

| | | |
|---|---|---|
| CN | 101925809 A | 12/2010 |
| CN | 103221806 A | 7/2013 |
| CN | 104764724 A | 7/2015 |
| CN | 105008919 A | 10/2015 |
| CN | 106680159 A | 5/2017 |
| KR | 10-2000-0004675 | 1/2000 |
| WO | WO 2009/032510 A1 | 3/2009 |
| WO | WO 2009/032513 A1 | 3/2009 |
| WO | WO 2017/060105 A1 | 4/2017 |
| WO | WO 2017/060164 A1 | 4/2017 |

OTHER PUBLICATIONS

Sergey A. Alexandrov et al. Synthetic Aperture Fourier Holographic Optical Microscopy. Physical Review Letters 97, 168102 (2006) (Year: 2006).*

China National Intellectual Property Administration, Office Action, CN Patent Application No. 201980010553.6, dated Nov. 3, 2021, 25 pages.

Chinese State Intellectual Property Office, First Office Action, Chinese Patent Application No. 200880104704.6, dated Dec. 19, 2011, 17 pages.

Cragg, G. et al., "Lateral Resolution Enhancement with Standing Evanescent Waves," Optics Letters, Jan. 1, 2000, vol. 25, No. 1, pp. 46-48.

Freimann, R., et al., "Development of a standing-wave fluorescence microscope with high nodal plane flatness," Journal of Microscopy, Sep. 1997, pp. 193-200, vol. 187, Pt. 3.

Frohn, J., et al., "Three-dimensional resolution enhancement in fluorescence microscopy by harmonic excitation," Optic Letters, Jun. 1, 2001, pp. 828-830, vol. 26, No. 11.

Frohn, J., et al., "True optical resolution beyond the Rayleigh limit achieved by standing wave illumination," PNAS, Jun. 20, 2000, pp. 7232-7236, vol. 97, No. 13.

Gustafsson, M.G.L., "Surpassing the lateral resolution limit by a factor of two using structured illumination microscopy," Journal of Microscopy, May 2000, pp. 82-87, vol. 198, Pt. 2.

Hong, S., et al., "Lensless focusing with subwavelength resolution by direct synthesis of the angular spectrum," Applied Physics Letters, Jun. 29, 2006, vol. 88, pp. 261107-1-261107-3.

Kim, J., et al., "Polony Multiplex Analysis of Gene Expression (PMAGE) in Mouse Hypertrophic Cardiomyopathy," Science, Jun. 8, 2007, pp. 1481-1484, vol. 316, with Supporting Online Material downloaded from the Internet at http://www.sciencemaa.ora/cai/data/316/5830/1481/DC1/2.

Korean Intellectual Property Office, Office Action, Korean Patent Application No. 10-2010-7004824, dated Jun. 5, 2012, twelve pages.

Korean Intellectual Property Office, Office Action, Korean Patent Application No. 10-2010-7004824, dated Oct. 21, 2011, eleven pages.

PCT International Search Report and Written Opinion, PCT Application No. PCT/US19/15881, dated Apr. 30, 2019, 11 pages.

PCT International Search Report and Written Opinion, PCT Patent Application No. PCT/US2011/028792, dated May 26, 2011, eleven pages.

PCT International Search Report and Written Opinion, PCT Patent Application No. PCT/US2011/028796, dated May 13, 2011, nine pages.

Ryu, J., "Resolution Improvement in Optical Microscopy by Use of Multi-Beam Interferometric Illumination,"Ph.D. Dissertation, Massachusetts Institute of Technology, 2003, pp. 3, 7-9, 109-111, and 119-122.

Ryu, J., et al., "Multibeam interferometric illumination as the primary source of resolution in optical microscopy," Applied Physics Letters, Apr. 28, 2006, vol. 88, pp. 171112-1-171112-3.

Schwider, J. et al., "Production and Control of Refractive and Diffractive Microlenses," 1993 Fourth International Conference on Holographic Systems, Components and Applications, 1993, pp. 47-53.

Shendure, J., et al., "Accurate Multiplex Polony Sequencing of an Evolved Bacterial Genome," Science, Sep. 9, 2005, pp. 1728-1732, vol. 309, with Supporting Online Material downloaded from the Internet at http://www.sciencemaa.ora/cai/data/1117389/DC1/1.

Taiwan Republic of China Intellectual Property Office, Search Report, Taiwan Patent Application No. 097131816, dated Dec. 18, 2012, 8 pages.

United States Office Action, U.S. Appl. No. 12/728,110, dated Jan. 28, 2013, 18 pages.

United States Office Action, U.S. Appl. No. 12/728,140, dated Aug. 29, 2013, 20 pages.

United States Office Action, U.S. Appl. No. 12/728,140, dated Feb. 1, 2013, 20 pages.

United States Office Action, U.S. Appl. No. 15/059,245, dated Nov. 29, 2016, 24 pages.

United States Office Action, U.S. Appl. No. 15/685,982, dated Nov. 26, 2018, 14 pages.

Zhi, Z. et al., "Microfabrication of Encoded Microparticle Array for Multiplexed DNA Hybridization Detection," *Chemical Communications*, No. 19, 2005, pp. 2448-2450.

China National Intellectual Property Administration, Office Action, Chinese Patent Application No. 201980010553.6, dated May 12, 2022, 10 pages.

Zhu, X. "Study of Key Techniques of Imaging Flow Cytometry for Bio-Particle Detection and Recognition," Chinese Doctoral Dissertation, Jul. 15, 2011, pp. 1-4.

* cited by examiner

METHOD FOR DETECTING PARTICLES USING STRUCTURED ILLUMINATION

CROSS-REFERENCE TO RELATED APPLICATIONS

This application is a continuation of U.S. patent application Ser. No. 16/262,429 filed on Jan. 30, 2019 which claims the benefit of U.S. Provisional Patent Application No. 62/624,071 filed on Jan. 30, 2018, which is incorporated by reference herein in its entirety.

BACKGROUND OF THE INVENTION

1. Field of the Invention

The present invention relates generally to the field of optical microscopy imaging which uses structured or selective illumination or excitation and, more specifically, to a method of detecting particles using measured signals from structured illumination patterns.

2. Description of the Related Art

Synthetic Aperture Optics (SAO) imaging refers to an optical imaging method in which a series of patterned or structured light patterns are used to illuminate the imaging target in order to achieve resolution beyond what is set by physical constraints of the imaging apparatus such as the lens and the camera. In SAO, an imaging target is selectively excited in order to detect the spatial frequency information of the target. Since there is a one-to-one relationship between the frequency (or Fourier) domain and the object (or target) domain, SAO can reconstruct the original imaging target by obtaining its spatial frequency information.

FIG. 1A illustrates a conventional SAO method, and FIG. 1B illustrates a conventional SAO system. Referring to FIGS. 1A and 1B together, in conventional SAO, selective excitation (or illumination) 104 is applied to an imaging target 102, and the light scattered or fluoresced from the imaging target 102 is captured by optical imaging 106. The imaging target 102 can be composed of micro-particles in a randomly or regularly distributed pattern. Selective excitation (or illumination) 104 may be applied to the imaging target 102 by an illumination apparatus (not shown in FIGS. 1A and 1B) that is configured to cause interference 122 of two or more light beams 131, 132 on the imaging target 102. The excitation is selective or patterned, unlike uniform illumination used in conventional optical imaging techniques. For example, two beams 131, 132 may overlay or interfere on an imaging-target plane 102 to produce a two-dimensional (2D) sinusoidal excitation pattern.

FIG. 1C illustrates an example of a selective excitation pattern in the spatial domain and the frequency domain. Referring to FIGS. 1B and 1C, the exemplary selective excitation pattern 140 in the spatial domain is generated by interference of two beams 131, 132 on the imaging-target plane 102, resulting in a 2D sinusoidal excitation pattern. The angle ($\varphi$) between the two beams 131, 132 determines the pitch 143 of the pattern, which represents the spacing or periodicity of 2D sinusoidal fringe pattern 140. More specifically, the pitch 143 is substantially inversely proportional to $\sin(\varphi)$. The orientation $\phi$ of the pattern represents the amount of angular rotation of the 2D sinusoidal fringes 140 compared to its reference pattern, which in this example of FIG. 1C is shown as a 2D sinusoid comprised of vertical lines, although a different reference pattern such as a 2D sinusoid comprised of horizontal lines can also be used as the reference pattern. In mathematical terms, the orientation $\phi$ can be described as follows: if $\underline{u}$ is the normal vector of the plane formed by the two beams 131, 132 and if the projected vector of $\underline{u}$ on the imaging plane 102 is called $\underline{v}$, then the orientation $\phi$ of the sinusoidal pattern 140 is the angular orientation of the vector $\underline{v}$ with respect to the frame of reference. The "phase" of the pattern is the periodic position of the 2D sinusoid with respect to the frame of reference. The range of the phases of the 2D sinusoid excitation pattern will be a value between 0 and $2\pi$. The different phases can be obtained by changing optical path length of one beam.

As shown in FIG. 1C, the 2D sinusoid excitation pattern in the spatial domain can be shown as a conjugate pair $k_i$, $k_i'$ in the corresponding frequency domain (k-space). Each conjugate pair in the k-space corresponds to the pitch 143 and orientation $\phi$ of the corresponding 2D sinusoid pattern. The pitch 143 of the 2D sinusoid pattern 140 is determined by the radial distance r of the k-space point—more precisely, the pitch 143 is substantially the inverse of the radial distance r in the frequency domain. The orientation $\phi$ is the angle $\phi$ of the k-space points in a radial coordinate system in the frequency domain. Thus, a number of different excitation patterns may be generated by changing the pitch 143 of the 2D sinusoid pattern (or the angle ($\varphi$) between the two beams 131, 132) and changing the orientation $\phi$ of the 2D sinusoid pattern, with each different pair of pitch 143 and orientation $\phi$ of the 2D sinusoid pattern in the spatial domain corresponding to a different conjugate pair (radial distance r and orientation $\phi$) in the k-space (frequency) domain.

Referring back to FIGS. 1A and 1B, the excited target 102 emits signals (or photons), and the signals are captured in optical imaging system 106 including an objective lens 124 and an imaging sensor (or imager) 126. The emitted signal will have a wavelength $\lambda_E$. The objective lens has magnification (Mag) and a numerical aperture NA=n×sin θ, where n is the index of refraction of the medium in which the lens 124 is placed and θ is the half-angle of the maximum cone of light that can enter or exit the lens 124. Typically, the imaging sensor 126 can be a charge-coupled device (CCD), complementary metal-oxide-semiconductor (CMOS) image sensor, or any other photon detectors in a matrix or array format including a plurality of pixels m. Note that, in some applications, the emitted signals from the target 102 may be directly captured by the imager 126 without going through the objective lens 124.

Then, it is determined 108 whether the images corresponding to all the phases of the 2D sinusoid excitation pattern were obtained. If images corresponding to all the phases of the 2D sinusoid excitation pattern were not obtained in step 108, the excitation phase is changed 114 and steps 104, 106, 108 are repeated for the changed excitation phase. If images corresponding to all the phases of the 2D sinusoid excitation pattern were obtained in step 108, then it is determined 110 whether the images corresponding to all the 2D sinusoid selective excitation patterns were obtained. If images corresponding to all the 2D sinusoid selective excitation patterns were not obtained in step 110, the excitation pattern is changed by using a different spatial frequency (e.g., changing the pitch 143 and the orientation $\phi$ of the 2D sinusoid pattern) and steps 104, 106, 108, 114 are repeated for the next selective excitation pattern.

If images corresponding to all the 2D sinusoid selective excitation patterns were obtained in step 110, then finally the captured images are sent to a computer for SAO post processing 112 and visualization. In conventional imaging, the resolution of the SAO imaging system is determined by the numerical aperture NA of the lens 124, the wavelength $\lambda_E$ of the emitted light, and the pixel size. In contrast, in SAO imaging, the resolution of the imaging system is beyond what can be achieved by the numerical aperture NA of the lens 124, the wavelength $\lambda_E$ of the emitted light, and the pixel size. Thus, as shown in FIG. 1B, the images captured through steps 104, 106, 108 of FIG. 1A are raw images $RI_i$ with a resolution lower than (insufficient for) the resolution needed to resolve the objects on the imaging target 102. However, multiple sets of the lower resolution raw images $RI_i$ are captured for different excitation phases and spatial frequencies (excitation patterns) to obtain the complete raw image set 128, which then goes through SAO post-processing 112 to synthesize the final image FI that has a resolution higher than the resolution of the raw images $RI_i$. The resolution of the final image FI obtained by SAO post-processing is sufficient for resolution of the objects on the imaging target 102. The methodology for SAO post-processing 112 for synthesizing high resolution images FI from lower resolution raw images $RI_i$ is well known. Raw images $RI_i$ are converted into k-space information of the high resolution images FI, and this information is Fourier transformed to synthesize or reconstruct the high resolution images FI. For example, one example of the SAO post-processing methodology can be found in U.S. Pat. No. 6,016,196, issued on Jan. 18, 2000 to Mermelstein, entitled "Multiple Beam Pair Optical Imaging," which is incorporated by reference herein.

Applying SAO to DNA (deoxyribonucleic acid) or RNA (ribonucleic acid) sequencing presents a number of challenges. The term "nucleic acid" herein includes both DNA and RNA. In DNA or RNA sequencing, single molecule or amplified clones of a DNA template (collectively referred to as "microparticle") are immobilized onto a planar substrate. The array of microparticles then goes through multiple cycles of chemical reaction and optical detection. FIGS. 2A, 2B, and 2C illustrate different types of individual sequencing microparticles that can be used for DNA sequencing. FIG. 2A illustrates an individual microparticle 202 formed by a 1-micrometer diameter bead 208 covered with clonal DNA molecules 210 that have been previously amplified by a water-in-oil emulsion PCR technique. The bead 208 is attached directly to the substrate 204 in fluid 206. FIG. 2B illustrates an individual microparticle 202 as a cluster of clonal DNA molecules 210 attached to the substrate 204 and placed in fluid 206. The DNA molecules 210 have been previously amplified by a bridge amplification technique. FIG. 2C illustrates an individual microparticle as a single DNA molecule 210 attached to the substrate 204 and placed in fluid 206. The single DNA molecule 210 is sequenced without amplification.

The distribution of DNA microparticles can be random or regular. FIGS. 3A and 3B illustrate some examples of the distribution of DNA microparticles. If $\Delta x$ is defined to be the spatial resolution of an imaging system (i.e., $\Delta x$ is the minimum distance of two point objects that can be resolved by the imaging system), $\Delta x$ is typically designed to be about half of the distance between adjacent microparticles 202 (see FIG. 3A). In DNA sequencing applications, it is highly desirable for an optical imaging system to achieve both high resolution and high scanning speed at the same time. SAO imaging is promising since it can image a large area using a low magnification lens and camera without sacrificing resolution. The resolution of SAO imaging is obtained from the high resolution illumination patterns and post-processing. However, SAO requires selective excitation to be repeated for a number of selective excitation patterns. Conventional SAO imaging uses a large number of SAO excitation patterns, often including many redundant or even irrelevant illumination patterns. The number of excitation patterns in conventional SAO is merely determined based on the hardware architecture of the illumination system, without regard to other factors. The large number of excitation patterns in conventional SAO makes it impractical for use in DNA sequencing, as conventional SAO does not offer the cost and throughput benefit in DNA sequencing compared to conventional optics. Also, conventional SAO hardware is large, complex, difficult to scale, and mechanically and thermally unstable, requiring large space and extremely careful control of temperature and mechanical vibration for continuous run, making it particularly impractical for use in DNA sequencing which requires repeated, continuous runs of SAO over a very large number of DNA microparticle arrays.

Typically, given the final reconstructed image, a detection system estimates whether particles are present on a plurality of regions on a target by generating a set of reconstruction estimates based on the intensity values of the reconstructed image. For example, a reconstruction estimate for a pixel location of the reconstructed image may indicate whether a particle is present at a corresponding region of the target by comparing the intensity value for the pixel location to a predetermined threshold. However, it is often difficult to detect particles with high accuracy in this manner due to, for example, the texture of the target that results in a noisy reconstruction image.

SUMMARY OF THE INVENTION

Embodiments of the present invention include a method for synthetic aperture optics (SAO) that minimizes the number of selective excitation patterns used to illuminate the imaging target based on the target's physical characteristics corresponding to spatial frequency content from the illuminated target and/or one or more parameters of the optical imaging system used for SAO. Embodiments of the present invention also include an SAO apparatus that includes a plurality of interference pattern generation modules that are arranged in a half-ring shape.

In one embodiment, an SAO method comprises illuminating the target including one or more objects with a predetermined number (N) of selective excitation patterns, where the number (N) of selective excitation patterns is determined based upon the objects' physical characteristics corresponding to spatial frequency content from the illuminated target, optically imaging the illuminated target at a resolution insufficient to resolve the objects on the target, and processing optical images of the illuminated target using information on the selective excitation patterns to obtain a final image of the illuminated target at a resolution sufficient to resolve the objects on the target. In another embodiment, the number (N) of selective excitation patterns corresponds to the number of k-space sampling points in a k-space sampling space in a frequency domain, with the extent of the k-space sampling space being substantially proportional to an inverse of a minimum distance ($\Delta x$) between the objects that is to be resolved by SAO, and with the inverse of the k-space sampling interval between the k-space sampling points being less than a width (w) of a detected area captured by a pixel of a system for said optical imaging.

In another embodiment, an SAO apparatus comprises a plurality of interference pattern generation modules (IPGMs), with each IPGM configured to generate a pair of light beams that interfere to generate a selective excitation pattern on the target at a predetermined orientation and a predetermined pitch, and with the IPGMs arranged in a half-ring shape. The SAO apparatus also comprises an optical imaging module configured to optically image the illuminated target at a resolution insufficient to resolve the objects on the target. The optical image of the illuminated target is further processed using information on the selective excitation patterns to obtain a final image of the illuminated target at a resolution sufficient to resolve the target. The number of IPGMs is equal to the number of selective excitation patterns used for performing SAO on the target. The IPGMs may be placed substantially symmetrically on a monolithic structure that has the half-ring shape.

According to various embodiments of the present invention, an optimized, minimum number of excitation patterns are used in SAO, thereby enabling SAO to be used with applications such as DNA sequencing that requires massive parallelization of SAO imaging in a short amount of time to make DNA sequencing with SAO commercially feasible. Thus, dramatic increase of throughput and reduction of cost for DNA sequencing can be achieved by using SAO according to the present invention.

Embodiments of the present disclosure also include a method for detecting particles on a target. Embodiments of the present disclosure also include a system for detecting particles on a target.

In one embodiment, a particle detection method comprises illuminating the target with a plurality of structured illumination patterns that are each characterized by a spatial frequency and an illumination phase, generating a plurality of raw images of the target by measuring optical signals from the illuminated target, each raw image including at least one raw intensity value obtained from measurements of the target illuminated with a corresponding structured illumination pattern, and for each of one or more regions of the target, generating a first estimate that indicates whether a particle is present at said each of one or more regions of the target. Generating the first estimate comprises for said each of one or more regions of the target, determining a modulation score by combining a set of raw intensity values from the plurality of raw images, the modulation score indicating a degree of variation in the set of raw intensity values in said each of one or more regions of the target, and generating the first estimate for said each of one or more regions of the target by comparing the modulation score for the region to a first threshold In another embodiment, a system for detecting particles on a target comprises a plurality of illumination modules configured to illuminate the target with a plurality of structured illumination patterns that are each characterized by a spatial frequency and an illumination phase. The system also comprises an optical imaging module configured to generate a plurality of raw images of the target by measuring optical signals from the illuminated target, each raw image including at least one raw intensity value obtained from measurements of the target illuminated with a corresponding structured illumination pattern. The system also comprises a detection module configured generate, for each of one or more regions of the target, a first estimate that indicates whether a particle is present at said each of one or more regions of the target, wherein for said each of one or more regions of the target. The detection module is further configured to determine a modulation score by combining a set of raw intensity values from the plurality of raw images, the modulation score indicating a degree of variation in the set of raw intensity values in said each of one or more regions of the target, and generate the first estimate for said each of one or more regions of the target by comparing the modulation score to a first threshold.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present invention can be readily understood by considering the following detailed description in conjunction with the accompanying drawings.

DETAILED DESCRIPTION OF EMBODIMENTS

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Synthetic aperture optics (SAO) imaging method according to various embodiments of the present invention minimizes the number of selective excitation patterns used to illuminate the imaging target, based on the target's physical characteristics corresponding to spatial frequency content from the illuminated target and/or one or more parameters of the optical imaging system used for SAO. Embodiments of the present invention also include an SAO apparatus that is optimized to perform the SAO method according to the present invention. The SAO apparatus includes a plurality of interference pattern generation modules that are arranged in a half-ring shape, each of which generates one selective excitation pattern for SAO.

Figure 1A:
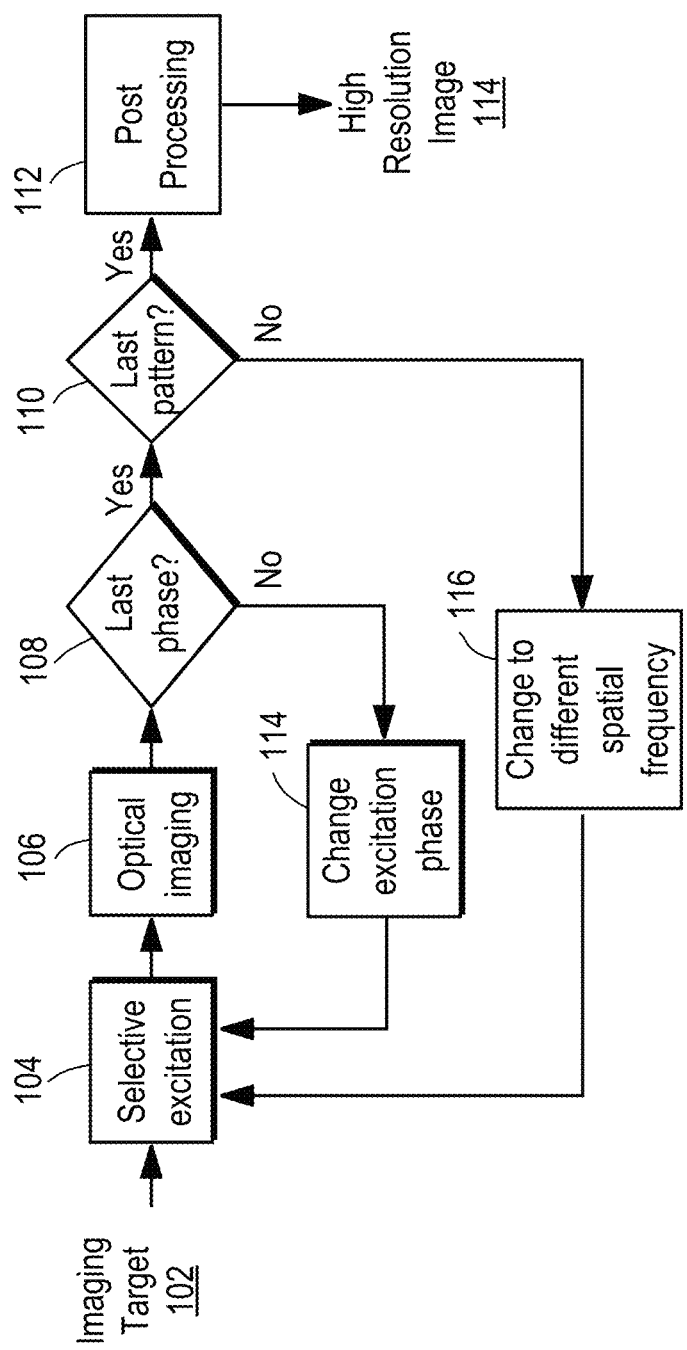
FIG. 1A illustrates a conventional SAO method.
Figure 1B:
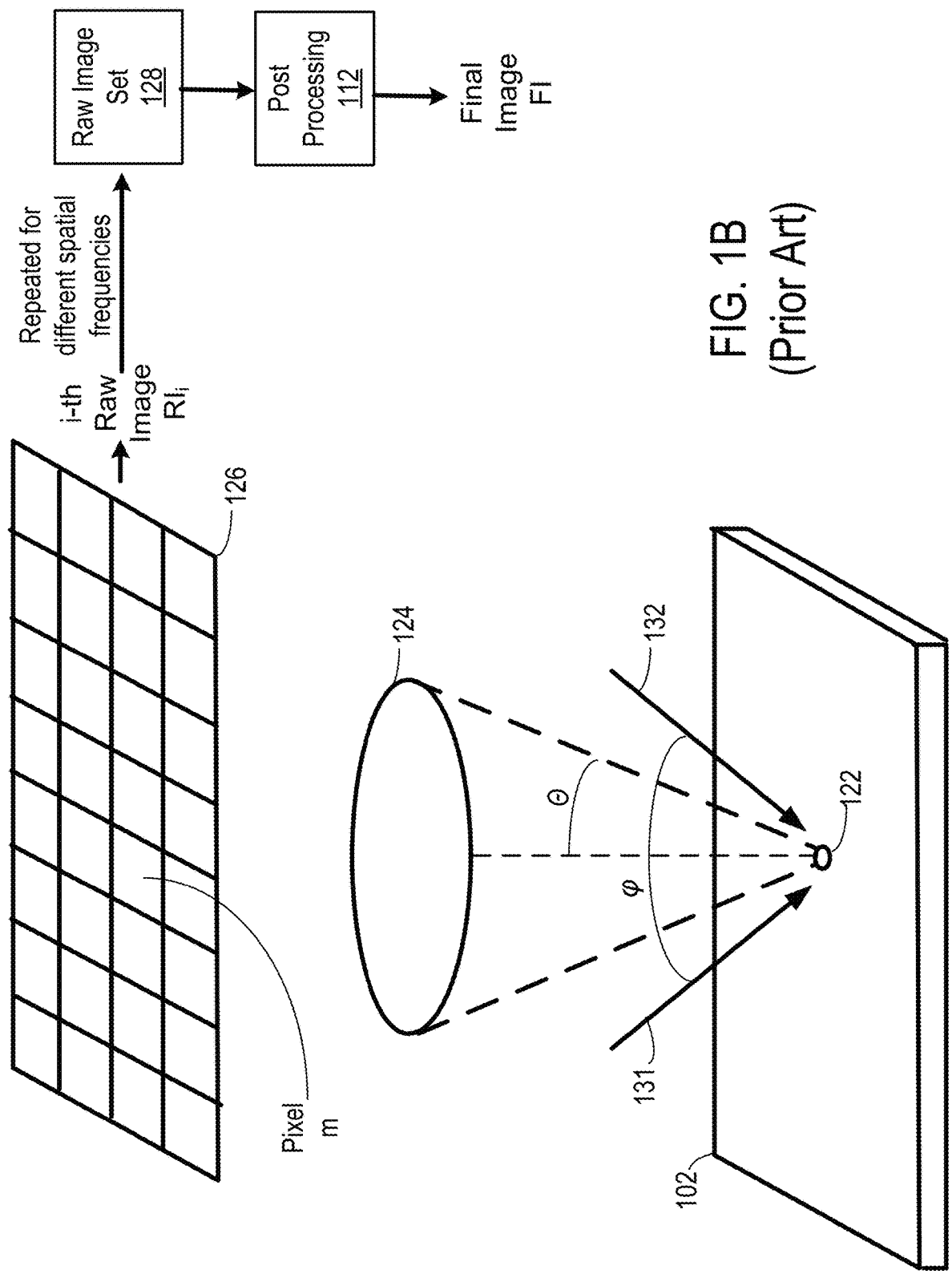
FIG. 1B illustrates a conventional SAO system.
Figure 1C:
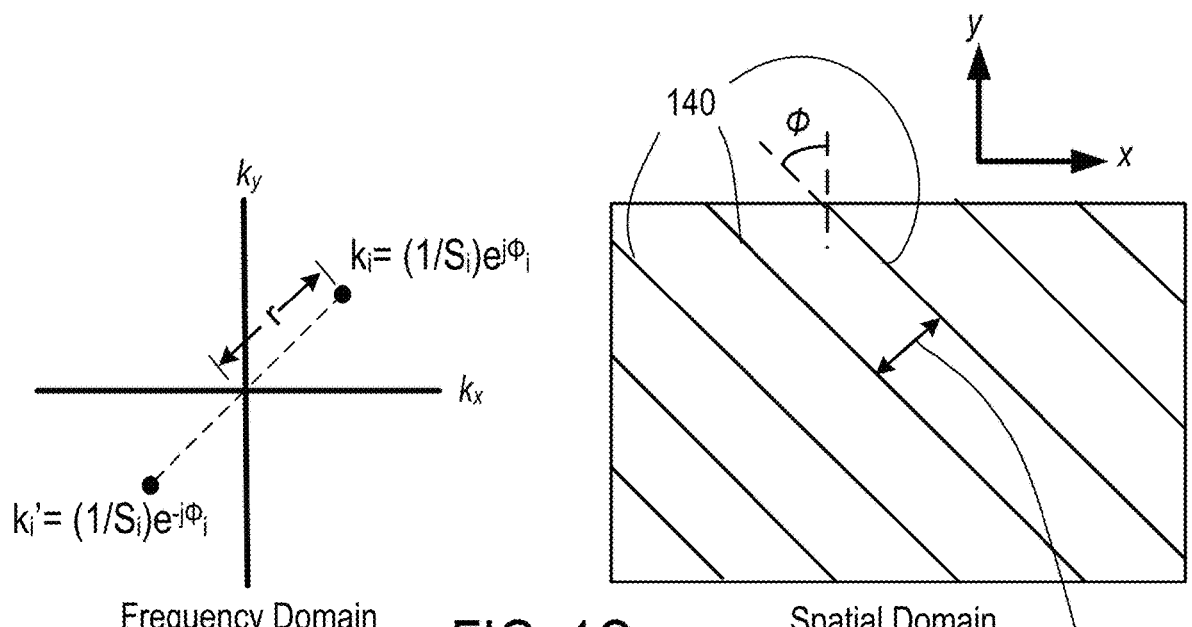
FIG. 1C illustrates an example of a selective excitation pattern in the spatial domain and the frequency domain.
Figure 2A:
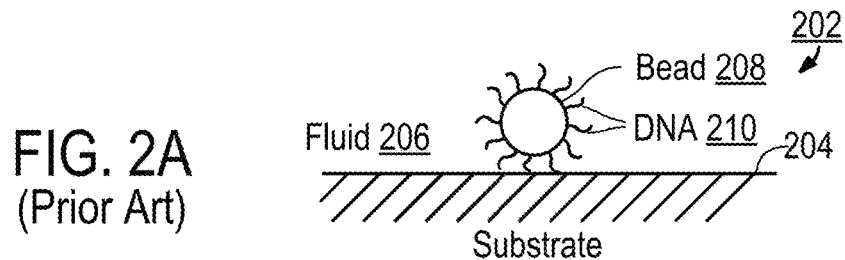
FIGS. 2A, 2B, and 2C illustrate different types of individual sequencing microparticles that can be used for DNA sequencing.
Figure 2B:
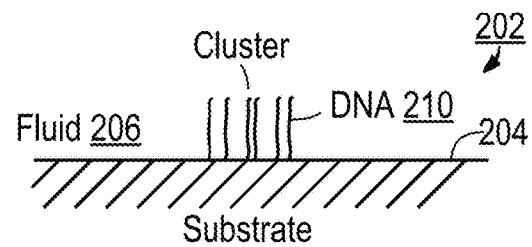
Figure 2C:
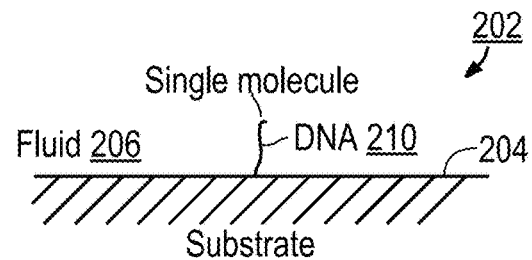
Figure 3A:
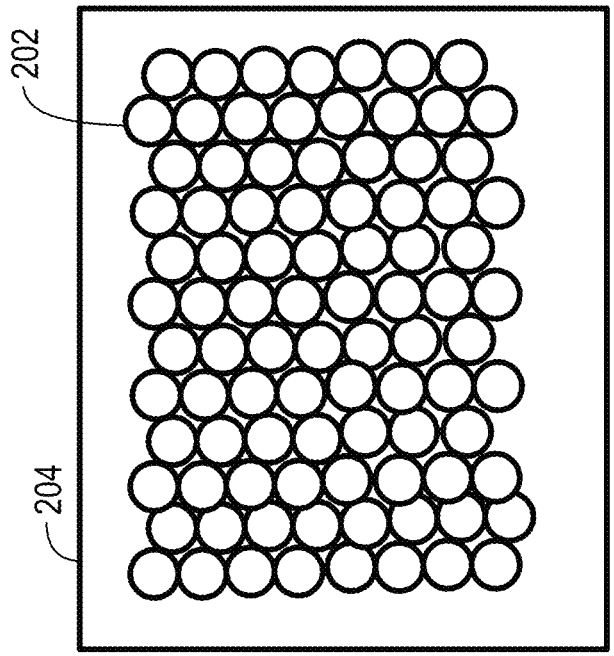
FIGS. 3A and 3B illustrate some examples of the distribution of DNA microparticles.
Figure 3B:
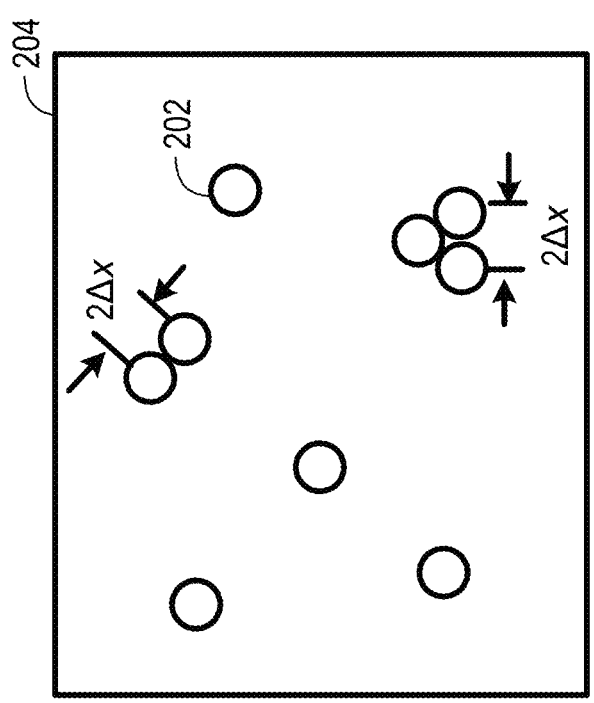
Figure 4:
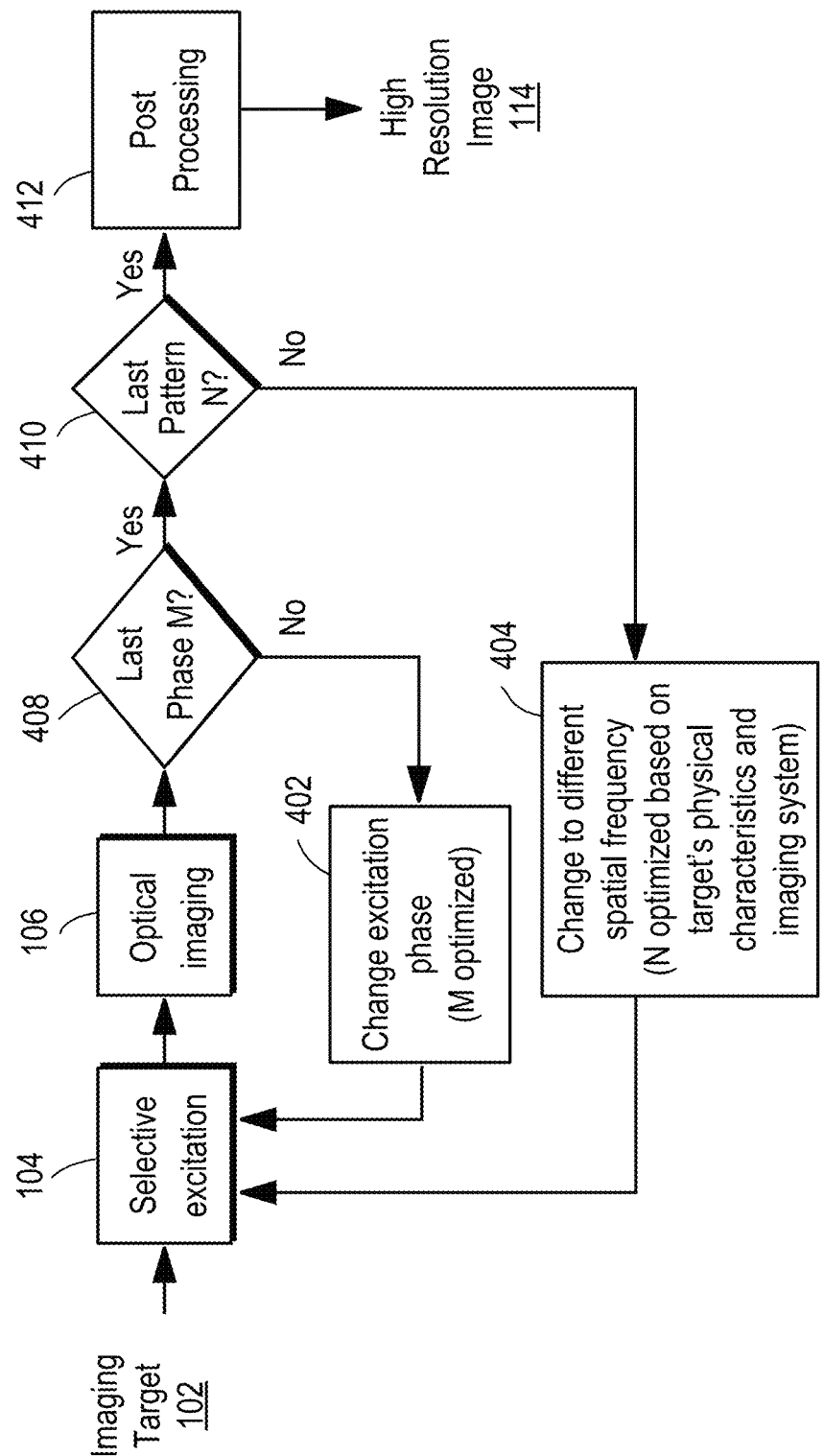
FIG. 4 illustrates an SAO method, according to one embodiment.

Turning to the figures, FIG. 4 illustrates an SAO method, according to one embodiment. As is typical with SAO imaging, selective excitation (or illumination) 104 is applied to an imaging target 102, and the light scattered or fluoresced from the imaging target 102 is captured by optical imaging 106. Here, the imaging target 102 is assumed to be a DNA microparticle such as those illustrated in FIGS. 2A-2C, 3A, and 3B, mRNA (messenger RNA) segments, lncRNA (long no-coding RNA), or proteins that appear as spots or particles when fluorescently labeled and imaged such as those illustrated in FIGS. 10-11, but is not limited hereto. As will be explained in more detail below with reference to FIGS. 7A-7D, selective excitation 104 is applied to the imaging target 102 by an illumination apparatus that is configured to cause interference of two light beams on the imaging target 102. The excited target 102 emits signals (or photons), and the emitted signals are captured in an optical imaging system 106 including an objective lens and an imaging sensor (or imager). Then, it is determined 408 whether the images corresponding to all M phases of the 2D sinusoid excitation pattern were obtained. If images corresponding to all the phases of the 2D sinusoid excitation pattern were not obtained in step 408, the excitation phase is changed 402 and steps 104, 106, 408 are repeated for the changed excitation phase. If images corresponding to all the phases of the 2D sinusoid excitation pattern were obtained in step 408, then it is determined 410 whether the images corresponding to all the 2D sinusoid selective excitation patterns were obtained. If images corresponding to all the 2D sinusoid excitation patterns were not obtained in step 410, the excitation pattern is changed by using a different spatial frequency (e.g., changing the pitch 143 and the orientation $\phi$ of the 2D sinusoid pattern) and steps 104, 106, 408, 402, 410, 404 are repeated for the next selective excitation pattern. Then, if images corresponding to all the 2D sinusoid excitation patterns were obtained in step 410, then the captured images are sent to a computer for SAO post processing 412 and visualization to obtain the high-resolution images 114 of the imaging target 102 from the captured lower resolution raw images. As explained above, the raw images captured by optical imaging 106 have a resolution insufficient to resolve the objects on the imaging target 102, while the high resolution image 114 reconstructed by SAO post-processing 412 have a resolution sufficient to resolve the objects on the imaging target 102.

The SAO method of the present invention uses an optimized number N of selective excitation patterns and an optimized number M of excitation phases of each selective excitation pattern, so that SAO can be used to image targets such as DNA microparticles in a massively parallel manner within a short amount of time. As explained above, the number of selective excitation patterns used in conventional SAO is determined merely by the hardware characteristics of the illumination system, independent and without consideration of the imaging target or the imaging system (objective lens and camera). Thus, the number of k-space sampling points corresponding to the selective excitation patterns in conventional SAO was not optimized, and has many redundant and sometimes irrelevant k-space sampling points. In contrast, SAO according to the embodiments of the present invention herein uses selective excitation patterns whose number N is optimized and minimized as a function of the imaging target's physical characteristics corresponding to spatial frequency content (e.g., the size, shape, and/or spacing of the objects on the imaging target). SAO according to the embodiments herein may also use selective excitation patterns whose number N is optimized alternatively or additionally as a function of various parameters of the imaging system (e.g., magnification (Mag) of the objective lens, numerical aperture (NA) of the objective lens, wavelength $\lambda_E$ of the light emitted from the imaging target, and/or effective pixel size p of the pixel sensitive area of the CCD, etc.). In this manner, the resulting number N of excitation patterns used in SAO becomes much smaller than that in conventional SAO, thereby enabling SAO to be used with DNA sequencing that requires massive parallelization of SAO imaging in a short amount of time to make DNA sequencing commercially feasible. Thus, dramatic reduction of cost and increase of throughput of DNA sequencing can be achieved.

Figure 5A:
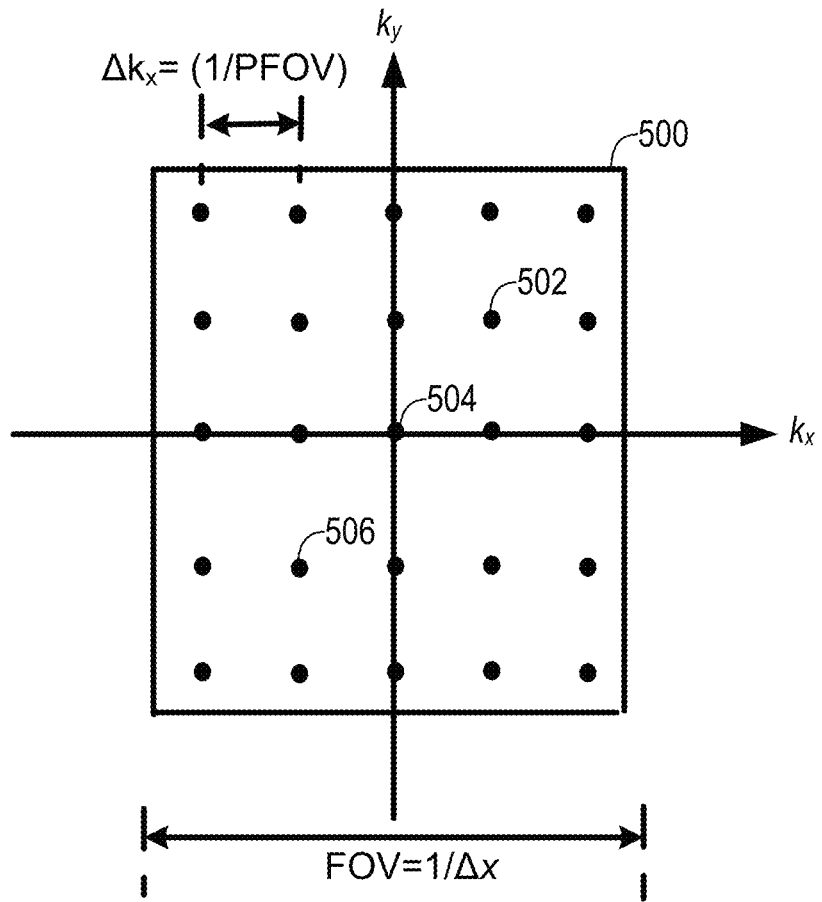
FIG. 5A illustrates the k-space sampling points (selective excitation patterns) used in SAO, according to one embodiment.

FIG. 5A illustrates the k-space sampling points (selective excitation patterns) used in SAO, according to one embodiment. In FIG. 5A, it is assumed that the CCD imaging area has a square shape and thus a square shaped k-space sampling space 500 for SAO is also assumed, although the description for FIG. 5A below can be applied to a non-square shaped (e.g., rectangular) k-space sampling space as well. The k-space sampling space 500 has an area of $FOV^2$, with the extent of the k-space sampling space in each of the horizontal and vertical directions being FOV. Here, FOV stands for the k-space field of view. In the k-space frequency domain, FOV should be equal to $(1/\Delta x)$, where $\Delta x$ the spatial resolution of an imaging system (i.e., $\Delta x$ is the minimum distance of two point objects that can be resolved by the imaging system). Each conjugate pair 502, 506 and its DC point 504 correspond to one selective excitation pattern for SAO as used with the present invention. Thus, the number of selective excitation patterns used in SAO corresponds to the number of conjugate pairs of k-space points in the k-space sampling space 500 (FOV×FOV). $\Delta k_x$ is the k-space sampling interval, and is equal to (1/PFOV) where PFOV is the pixel field of view. The smaller the k-space sampling interval $\Delta k_x$ is in the k-space sampling space 500, the larger the number of k-space points and the corresponding number of excitation patterns are. Specifically, the following equations hold:

$$N=\text{floor}(L/2) \quad \text{(Equation 1)},$$

where L is the number of k-space points in the k-space, N is the number of selective excitation patterns, and floor ( ) rounds the number to the nearest but smallest integer;

$$L=\text{round}((\text{FOV}/\Delta k_x)^2)=\text{round}((\text{PFOV}/\Delta x)^2) \quad \text{(Equation 2)},$$

where round ( ) rounds the number to the nearest integer, and PFOV is the extent in the reciprocal (or Fourier) space of the sampling space (k-space) to be reconstructed from the samples.

Figure 5B:
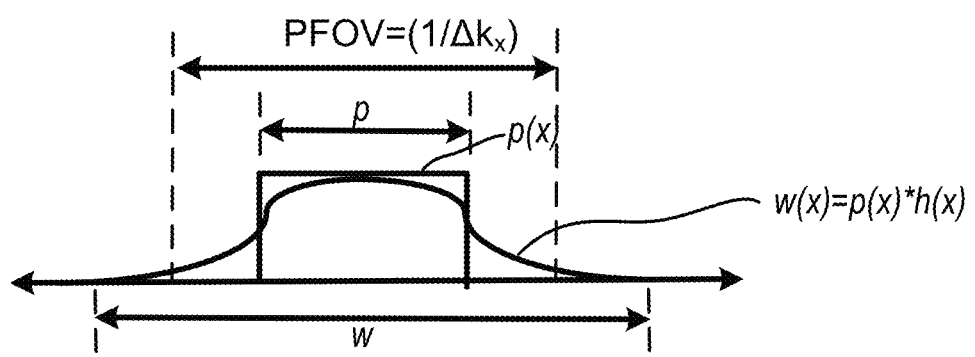
FIG. 5B illustrates the selection of the k-space sampling interval used in SAO, according to one embodiment.

FIG. 5B illustrates the selection of the k-space sampling interval used in SAO, according to one embodiment. As explained above, the imaging target size determines the required spatial resolution $\Delta x$. Magnification (Mag) and CCD pixel size (Z) determines the effective pixel size p on the imaging-target plane, p=Z/Mag. As shown in FIG. 5B, the detected area w(x) (i.e., the area captured by the pixel) can be represented as the convolution of the pixel-sensitivity function p(x) (e.g., the rectangular function with width p) and the point-spread function (PSF) h(x) of the lens (e.g., a bell-shaped curve). The width w can be defined as the $1/e^2$ width of detected area w(x). Since the PSF of the lens is determined by the NA of the lens, the extent of the detected area (w) and the weighting over the detected area (i.e., the effective sensitivity profile over the detected area) are the function of the magnification (Mag) of the lens, numerical aperture (NA) of the lens, and the CCD pixel size (Z).

As can be seen from the above, the k-space sampling space (FOV) is determined by the desired spatial resolution $\Delta x$ and is dictated by the imaging target. The particles of interest, such as biological particles like DNA microparticles or mRNA segments typically have a very small size, resulting in a large k-space sampling space. In conventional SAO, the k-space sampling interval $\Delta k_x$ is set without regard to the physical characteristics of the imaging target or the parameters of the imaging system, and is rather just set randomly according to whatever interval allowed by the SAO illumination system. This made the number of k-space points and the resulting selective excitation patterns prohibitively large for use in DNA sequencing applications using SAO, because of the high cost and low throughput of DNA sequencing using such large number of selective excitation patterns in SAO.

In contrast, SAO according to the embodiments of the present invention herein use selective excitation patterns whose number N is optimized as a function of the imaging target's physical characteristics corresponding to spatial frequency content (e.g., the size, shape, and/or spacing of the imaging target). As shown in FIG. 5B, in one embodiment, the pixel field of view PFOV is selected to be smaller than the extent (w) of the detected area, i.e., PFOV<w. Using a small PFOV results in a larger k-space sampling interval $\Delta k_x$, thereby reducing the number (L) of k-space points in the k-space sampling space 500 and the resulting number (N) of selective excitation patterns for use in SAO. As will be explained in more detail below with reference to FIGS. 6A and 6B, using PFOV smaller than the extent (w) of the detected area causes aliasing in the high resolution image obtained from SAO, but such aliasing can be removed using the method as described below with reference to FIG. 6C. In other embodiments, the PFOV may be set to be equal to or larger than the extent (w) of the detected area, thereby preventing aliasing from occurring in the high resolution image obtained from SAO. Also note that setting PFOV with consideration of the extent (w) of the detected area effectively sets the k-space sampling interval ($\Delta k_x$) and the resulting number (N) of selective excitation patterns based on the various parameters of the imaging system, since the extent (w) of the detected area is a function of the magnification (Mag) of the lens, numerical aperture (NA) of the lens, and the CCD pixel size (Z) as explained above.

Furthermore, SAO according to the embodiments herein further reduces the number of iterations of selective excitation and imaging by minimizing the number of phase changes (M in steps 402, 408 of FIG. 4). Referring back to FIG. 5A and as explained above, one conjugate pair 502, 506 of k-space points corresponds to one SAO interference pattern generation module that produces a specific pitch and orientation of one selective excitation pattern. The DC point 504 corresponds to the signal offset of the 2D sinusoid selective excitation pattern. Thus, in one embodiment, three different measurements at three different phases of the interference pattern with the same pitch and orientation are made to distinguish between the two conjugate points 502, 506 and the DC point 504 in the k-space. This is in contrast to conventional SAO, where more than three phases were used to illuminate and image each selective excitation pattern for SAO. In another embodiment, since the DC point 504 is common for all conjugate pairs 502, 506, it is also possible to utilize the DC point 504 obtained in one 2D sinusoid pattern with a specific pitch and orientation to obviate the need for illuminating and imaging the selective excitation pattern at the DC point 504 of another selective excitation pattern with a different pitch and orientation, thereby reducing the number M of changed phases needed for imaging in steps 402, 408 (FIG. 4) to two (2) phases for the other selective excitation patterns. In other words, each interference pattern generation module produces a pattern with only two different phases, except one module that produces pattern with three different phases to acquire the DC point 504. For optimal tolerance to noise, one can choose specific phases for the patterns. For three different phases per a specific selective excitation pattern, the optimal phase difference may be 0, 120, and 240 degrees. For two different phases per a specific selective excitation pattern, the optimal phase difference may be 0 and 90 degrees.

Figure 5C:
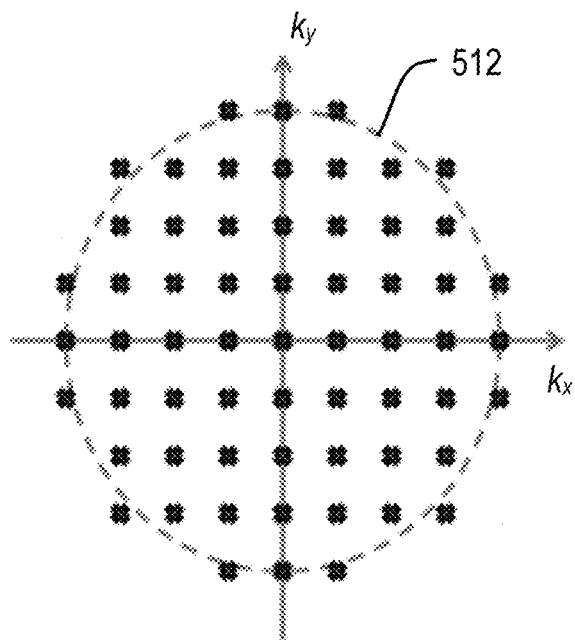
FIG. 5C illustrates using selective excitation patterns corresponding to k-space sampling points within a circular region, according to one embodiment.

Since the objects of interest (i.e., biological particles such as DNA microparticles, mRNA segments, lncRNA, or proteins) are typically circularly symmetric, the k-space spectrum of the objects of interest will also be circularly symmetric and thus only k-space samples in the circular region with diameter of FOV (=1/$\Delta x$) may be needed for SAO. Thus, in one embodiment, the SAO according to the present invention uses selective excitation patterns corresponding to the k-space sampling points within the circular region 512, as shown in FIG. 5C.

Figure 5D:
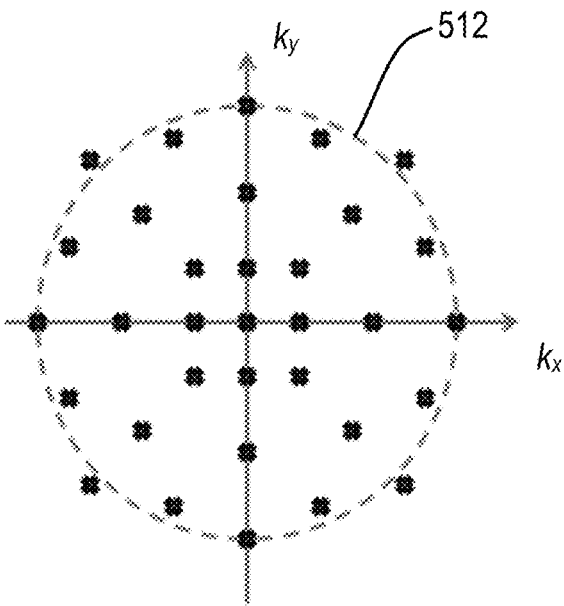
FIG. 5D illustrates reducing the number of k-space sampling points by sparse k-space sampling, according to one embodiment.

FIG. 5D illustrates reducing the number of k-space sampling points by sparse k-space sampling, according to one embodiment. Conventional SAO methods do not utilize frequency information of the objects in the image scene.

Solid objects such as beads used in microparticles have much less energy in the high spatial-frequencies compared to the low frequencies. Therefore, under-sampling in the high spatial frequencies is more tolerable than under-sampling in the low spatial frequency region. Thus, in one embodiment of the present invention, the number (N) of selective excitation patterns is further reduced by non-uniform or variable-density sampling in the Fourier space as shown in FIG. 5D. The penalty for not meeting the Nyquist sampling rate in high spatial frequencies is tolerable in SAO for DNA sequencing applications, and thus SAO according to the embodiments herein relaxes the Nyquist sampling criteria in the higher-frequencies, thereby reducing the number of selective excitation patterns by almost half of what would be required with uniform sampling. For example, the number of k-space samples in the embodiment of FIG. 5D is only 54% of the number of k-space samples in the embodiment of FIG. 5C.

Figure 6A:
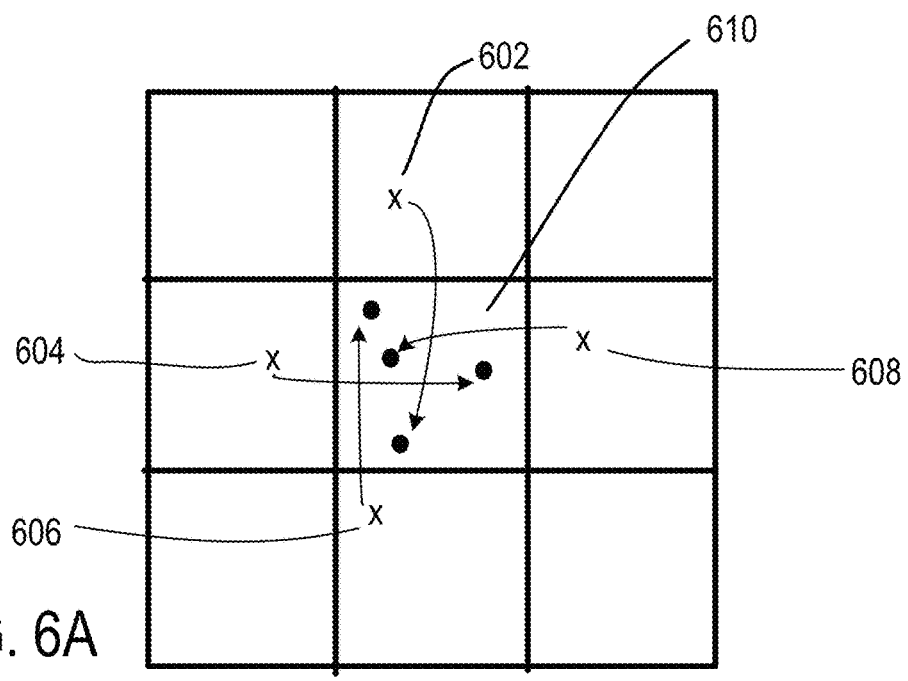
FIG. 6A illustrates how aliasing occurs in SAO by use of a pixel field of view (PFOV) smaller than the detected area, according to one embodiment.

FIG. 6A illustrates how aliasing occurs in SAO by use of a pixel field of view smaller than the detected area, according to one embodiment. As mentioned above with reference to FIG. 5B, using a pixel field of view (PFOV) smaller than the extent (w) of the detected area, i.e., PFOV<w, results in aliasing in the image obtained for SAO, because each pixel in the CCD would detect areas larger than the pixel itself. The extra area (i.e., left and right parts of the extent (w) outside of p(x)) is the area also detected by its neighboring pixels in the CCD. This is illustrated in FIG. 6A, where the objects 602, 604, 606, 608 detected in the extra area in the neighboring pixels will enter into the center pixel 610 (assuming rectilinear sampling in the k-space), resulting in aliasing and unwanted artifacts that degrade the image quality.

Figure 6B:
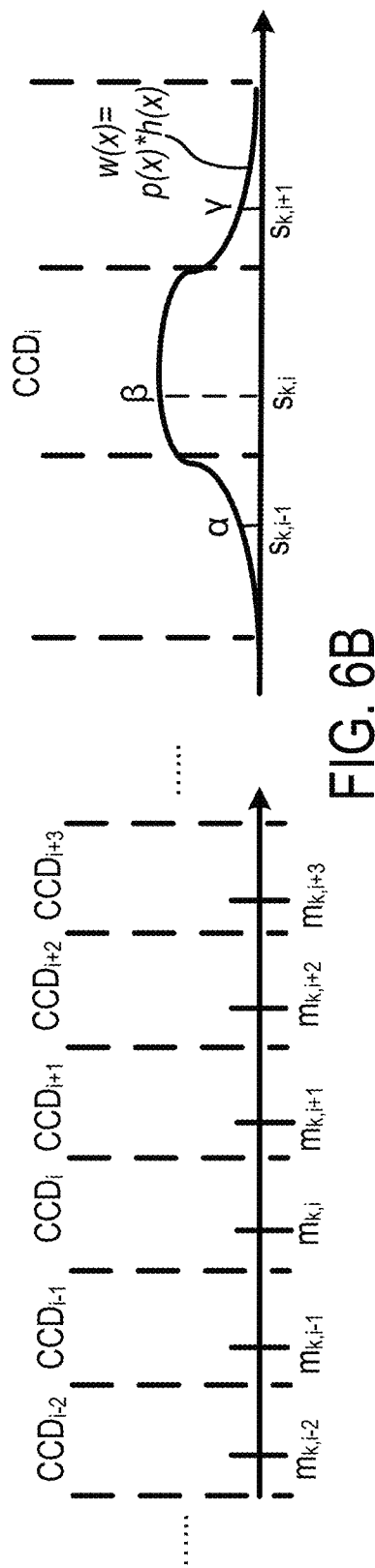
FIG. 6B illustrates how the actual signal at a pixel of an imaging system may be determined by unfolding the measured signal at the pixel to remove aliasing, according to one embodiment.

FIG. 6B illustrates how the actual signal at a pixel of an imaging system may be determined by unfolding the measured signal at the pixel to remove aliasing, according to one embodiment. In order to remove aliasing in the measured image signal and obtain the actual image signals, one can formulate a linear equation in the form of y=Ax at a particular sub-pixel k at pixel $CCD_i$ of the CCD. Referring to FIG. 6B, $m_{k,i}$ represents the measured signal (including aliasing) at a particular k-th sub-pixel location within the i-th CCD pixel $CCD_i$. Note that the relative locations of all measured signals $m_{k,i}$ (i=1, . . . , ∞) within their i-th CCD pixels are the same. $s_{k,i}$ represents the actual or ideal signal of the object at the k-th sub-pixel locations within the i-th CCD pixel $CCD_i$. α, β, and γ represent the values of the weighting function w(x) of the i-th CCD pixel at the locations corresponding to $s_{k,i-1}$, $s_{k,i}$, and $s_{k,i+1}$, respectively, and $s_{k,i}$ (i=1, . . . , ∞) is the actual (ideal) signal at the particular k-th sub-pixel location within the i-th CCD pixel $CCD_i$. As explained above, the weighting function w(x) can be represented as the convolution of the pixel-sensitivity function p(x) (e.g., the rectangular function with width p) and the point-spread function (PSF) h(x) of the lens (e.g., a bell-shaped curve). With these parameters defined and assuming that the number of pixels of the CCD is infinite, one can write the signal-equation series for a particular $k^{th}$ sub-pixel location as a linear matrix equation y=Ax, where y=[$m_{k,1}$, $m_{k,2}$, . . . ], x=[$s_{k,1}$, $s_{k,2}$, . . . ], and A is a matrix with elements being zeros and values of the weighting function (e.g., α, β, and γ). The linear matrix equation y=Ax shows that the "unfolding" process (i.e., recovering the actual signal $s_{k,i}$) can be viewed as a common inverse problem of y=Ax (i.e., x=$A^{-1}$y). In other embodiments, if non-rectilinear sampling pattern is used (e.g., variable-density, radial sampling, etc.), the actual relationship between $s_i$ and $m_i$ will change from that shown in FIG. 6B, in which case the point-spread-function (i.e., impulse response) can be measured in either simulation or real experiments to construct the inversion matrix ($A^{-1}$).

Figure 6C:
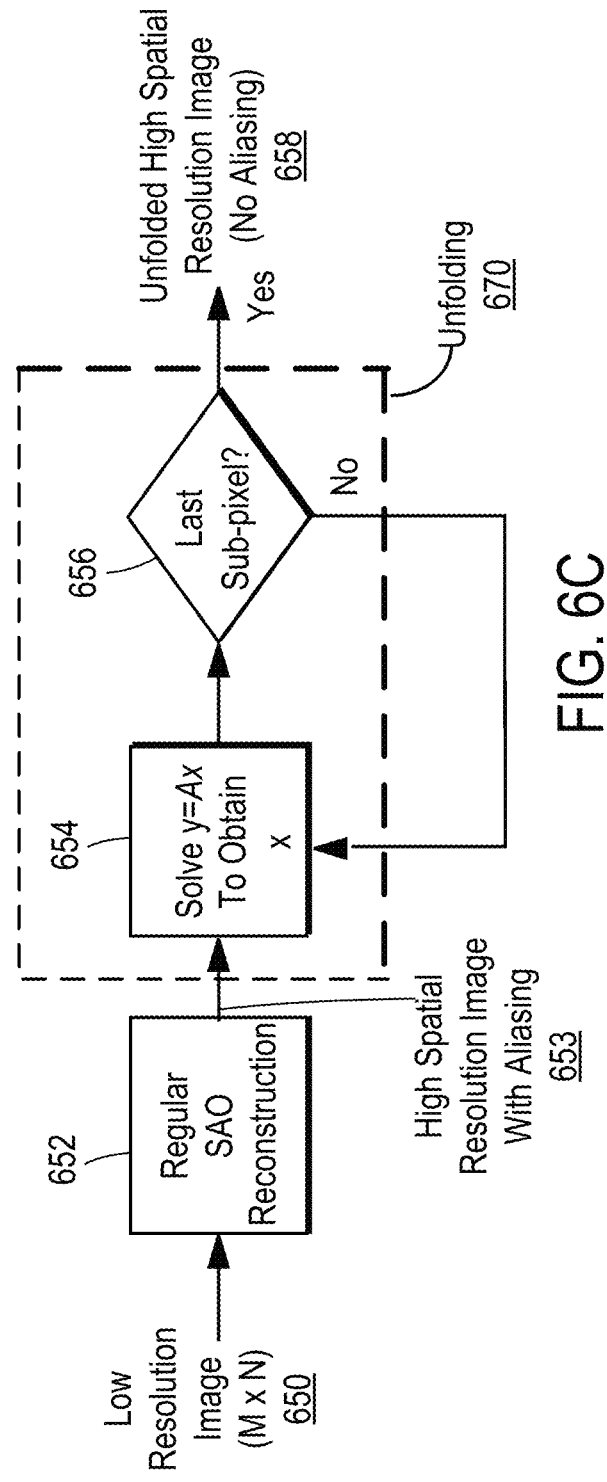
FIG. 6C illustrates a method of unfolding the measured signal at the pixel to remove aliasing, according to one embodiment.

FIG. 6C illustrates a method of unfolding the measured signal at the pixel to remove aliasing, according to one embodiment. The steps 652, 654, 656 together constitute the post-processing steps for SAO. In conventional SAO, post-processing includes only the regular SAO reconstruction 652 to generate the high spatial resolution image 653 from the low resolution images (M×N) 650 obtained from selective excitation of the imaging target. However, in SAO according to the embodiments of the present invention herein, post-processing includes the "unfolding" step 670 to remove aliasing from the high spatial resolution image 653 that contains aliasing resulting from using PFOV smaller than the extent (w) of the detected area for selective excitation. The unfolding process 670 includes solving the linear equation y=Ax to recover the actual signals x, which is repeated 656 at each sub-pixel location, for all CCD pixels. As a result, a high spatial resolution image 658 without aliasing can be obtained from SAO, despite using PFOV smaller than the extent (w) of the detected area for selective excitation in SAO.

Note that "unfolding" as explained herein can also be used to improve the SAO image reconstruction quality even when PFOV larger than or equal to the extent (w) of the detected area is used for selective excitation in SAO. In conventional SAO, the reconstructed pixels are simply cropped (to the width being p) and stitched together. This way of "crop and stitch" still does not undo the apodization caused by the weighting function w(x). In contrast, "unfolding" may be used according to the present invention even when PFOV larger than or equal to the extent (w) of the detected area is used for selective excitation in SAO such that no aliasing occurs. Since the unfold process is fundamentally undoing (i.e., unapodizing) the weighting function w(x), the "unfold" process can also be used to improve image reconstruction even when PFOV>=w is used for SAO selective excitation.

Figure 7A:
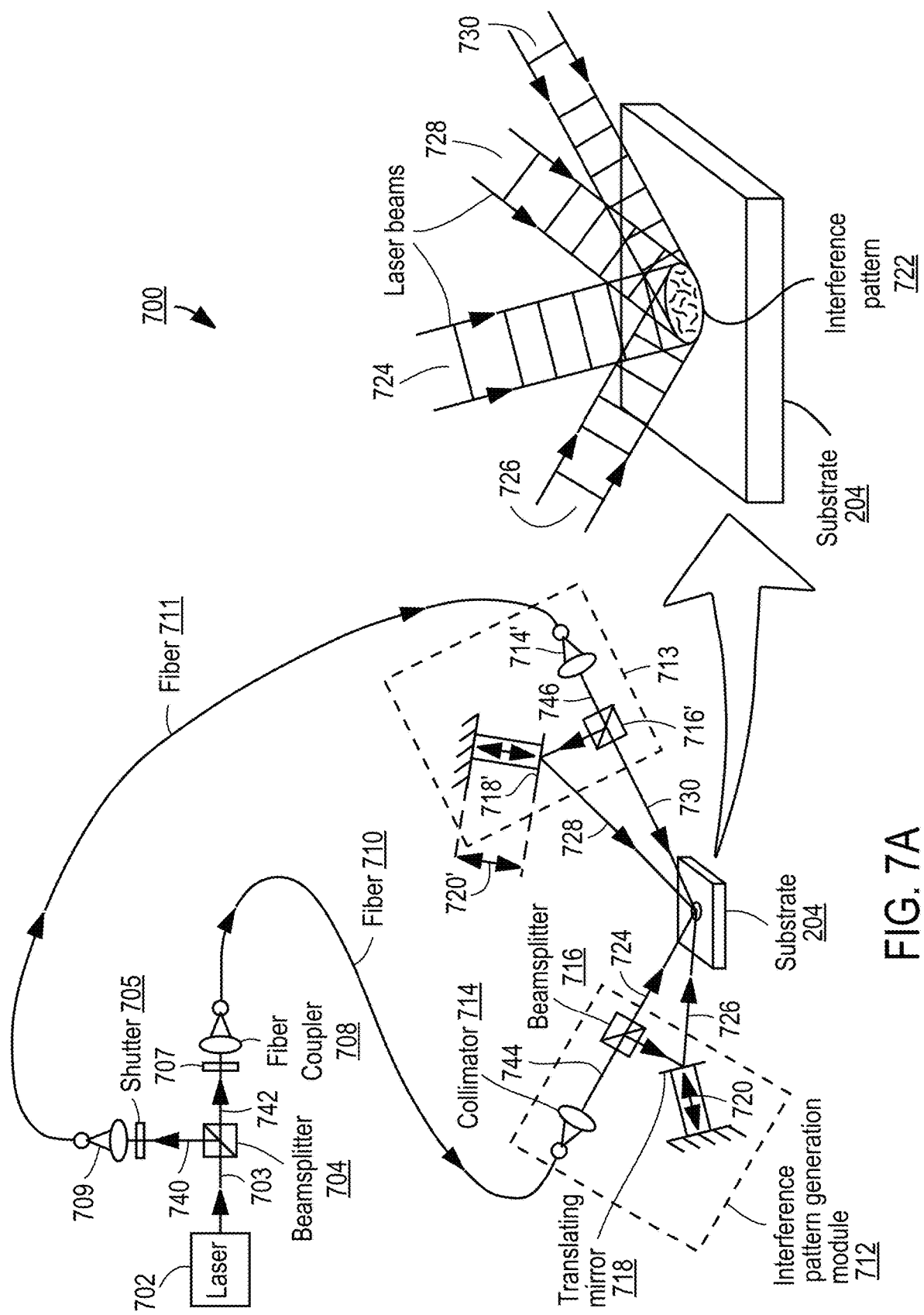
FIG. 7A illustrates a structured illumination apparatus for selectively exciting the microparticles, according to one embodiment.

FIG. 7A illustrates a structured illumination apparatus for selectively exciting the microparticles, according to one embodiment. The illumination apparatus shown in FIG. 7A is merely exemplary, and various modifications may be made to the configuration of the illumination apparatus for SAO according to the present invention. The example illumination apparatus in FIG. 7A shows only two interference pattern generation modules (IPGM) 712, 713 for simplicity of illustration, but for biological sequencing applications such as real DNA sequencing applications, mRNA sequencing applications, or lncRNA sequencing applications there would be a larger number of IPGMs. Each IPGM is in modular form and is configured to generate one selective excitation pattern at a given pitch and orientation, corresponding to one conjugate pair of the k-space sampling points. Thus, there is a one-to-one relationship between an IPGM and a 2-D sinusoid selective excitation pattern at a given pitch and orientation and to one conjugate pair of the k-space sampling points. A larger number (N) of selective excitation patterns would require a larger number of IPGMs in the SAO illumination apparatus.

The structured illumination apparatus 700 generates multiple mutually-coherent laser beams, the interference of which produces interference patterns. Such interference patterns are projected onto the microparticle array substrate 204 and selectively excite the DNA microparticles 202. Using the interference of multiple laser beams to generate the interference patterns is advantageous for many reasons. For example, this enables high-resolution excitation patterns with extremely large FOV and DOF. Although the structured illumination apparatus of FIG. 7A is described herein with the example of generating excitation patterns for DNA microparticles, it should be noted that the structured illumination apparatus of FIG. 7A can be used for any other type of application to generate excitation patterns for imaging any other type of target, such as biological particles including DNA segments, mRNA (messenger RNA) segments, lncRNA (long no-coding RNA), or proteins that appear as spots or particles when fluorescently labeled and imaged. Examples of imaging mRNA segments using selective excitation patterns are described below in conjunction with FIGS. 10-11.

Referring to FIG. 7A, the structured illumination apparatus 700 includes a laser 702, a beam splitter 704, shutters 705, 707, fiber couplers 708, 709, a pair of optical fibers 710, 711, and a pair of interference pattern generation modules (IPGMs) 712, 713. As explained above, each IPGM 712, 713 generates an interference pattern (selective excitation pattern) that corresponds to one conjugate pair of k-space sampling points. The beam 703 of the laser 702 is split by the beam splitter 704 into two beams 740, 742. A pair of high-speed shutters 705, 707 is used to switch each beam 740, 742 "on" or "off" respectively, or to modulate the amplitude of each beam 740, 742, respectively. Such switched laser beams are coupled into a pair of polarization-maintaining optical fibers 711, 710 via fiber couplers 709, 708. Each fiber 711, 710 is connected to a corresponding interference pattern generation module 713, 712, respectively. The interference pattern generation module 713 includes a collimating lens 714', a beam splitter 716', and a translating mirror 718', and likewise the interference pattern generation module 712 includes a collimating lens 714, a beam splitter 716, and a translating mirror 718.

The beam 744 from the optical fiber 710 is collimated by the collimating lens 714 and split into two beams 724, 726 by the beam splitter 716. The mirror 718 is translated by an actuator 720 to vary the optical path-length of the beam 726. Thus, an interference pattern 722 is generated on the substrate 204 in the region of overlap between the two laser beams 724, 726, with the phase of the pattern changed by varying the optical path-length of one of the beams 726 (i.e., by modulating the optical phase of the beam 726 by use of the translating mirror 718).

Similarly, the beam 746 from the optical fiber 711 is collimated by the collimating lens 714' and split into two beams 728, 730 by the beam splitter 716'. The mirror 718' is translated by an actuator 720' to vary the optical path-length of the beam 728. Thus, the interference pattern 722 is generated on the substrate 204 in the region of overlap between the two laser beams 728, 730, with the pattern changed by varying the optical path-length of one of the beams 728 (i.e., by modulating the optical phase of the beam 728 by use of the translating mirror 718').

As shown in FIG. 7A, each IPGM 712, 713 is implemented in modular form according to the embodiments herein, and one IPGM produces an interference pattern corresponding to one conjugate pair of k-space points. This modularized one-to-one relationship between the IPGM and the k-space points greatly simplifies the hardware design process for SAO according to the embodiments herein. As the number of selective excitation patterns used for SAO is increased or decreased, the SAO hardware is simply changed by increasing or decreasing the number of IPGMs in a modular manner. In contrast, conventional SAO apparatuses did not have discrete interference pattern generation modules but had a series of split beams producing as many multiple interferences as possible. Such conventional way of designing SAO apparatuses produced non-optimized or redundant patterns, slowing down and complicating the operation of the SAO system.

While this implementation illustrated in FIG. 7A is used for its simplicity, various other approaches can be used within the scope of the present invention. For example, the amplitude, polarization, direction, and wavelength, in addition to or instead of the optical amplitude and phase, of one or more of the beams 724, 726, 728, 730 can be modulated to change the excitation pattern 722. Also, the structured illumination can be simply translated with respect to the microparticle array to change the excitation pattern. Similarly, the microparticle array can be translated with respect to the structured illumination to change the excitation pattern. Also, various types of optical modulators can be used in addition to or instead of the translating mirrors 718, 718', such as acousto-optic modulators, electro-optic modulators, a rotating window modulated by a galvanometer and micro-electro-mechanical systems (MEMS) modulators. In addition, although the structured illumination apparatus of FIG. 7A is described herein as using a laser 702 as the illumination source for coherent electro-magnetic radiation, other types of coherent electro-magnetic radiation sources such as an SLD (super-luminescent diode) may be used in place of the laser 702.

Also, although FIG. 7A illustrates use of four beams 724, 726, 728, 730 to generate the interference pattern 722, larger number of laser beams can be used by splitting the source laser beam into more than two beams. For example, 64 beams may be used to generate the interference pattern 722. In addition, the beam combinations do not need to be restricted to pair-wise combinations. For example, three beams 724, 726, 728, or three beams 724, 726, 730, or three beams 724, 728, 730, or three beams 726, 729, 730, or all four beams 724, 726, 728, 730 can be used to generate the interference pattern 722. Typically, a minimal set of beam combinations (two beams) is chosen as necessary to maximize speed. Also, the beams can be collimated, converging, or diverging. Although different from the specific implementations of FIG. 7A and for different applications, additional general background information on generating interference patterns using multiple beam pairs can be found in (i) U.S. Pat. No. 6,016,196, issued on Jan. 18, 2000 to Mermelstein, entitled "Multiple Beam Pair Optical Imaging," (ii) U.S. Pat. No. 6,140,660, issued on Oct. 31, 2000 to Mermelstein, entitled "Optical Synthetic Aperture Array," and (iii) U.S. Pat. No. 6,548,820, issued on Apr. 15, 2003 to Mermelstein, entitled "Optical Synthetic Aperture Array," all of which are incorporated by reference herein.

Figure 7B:
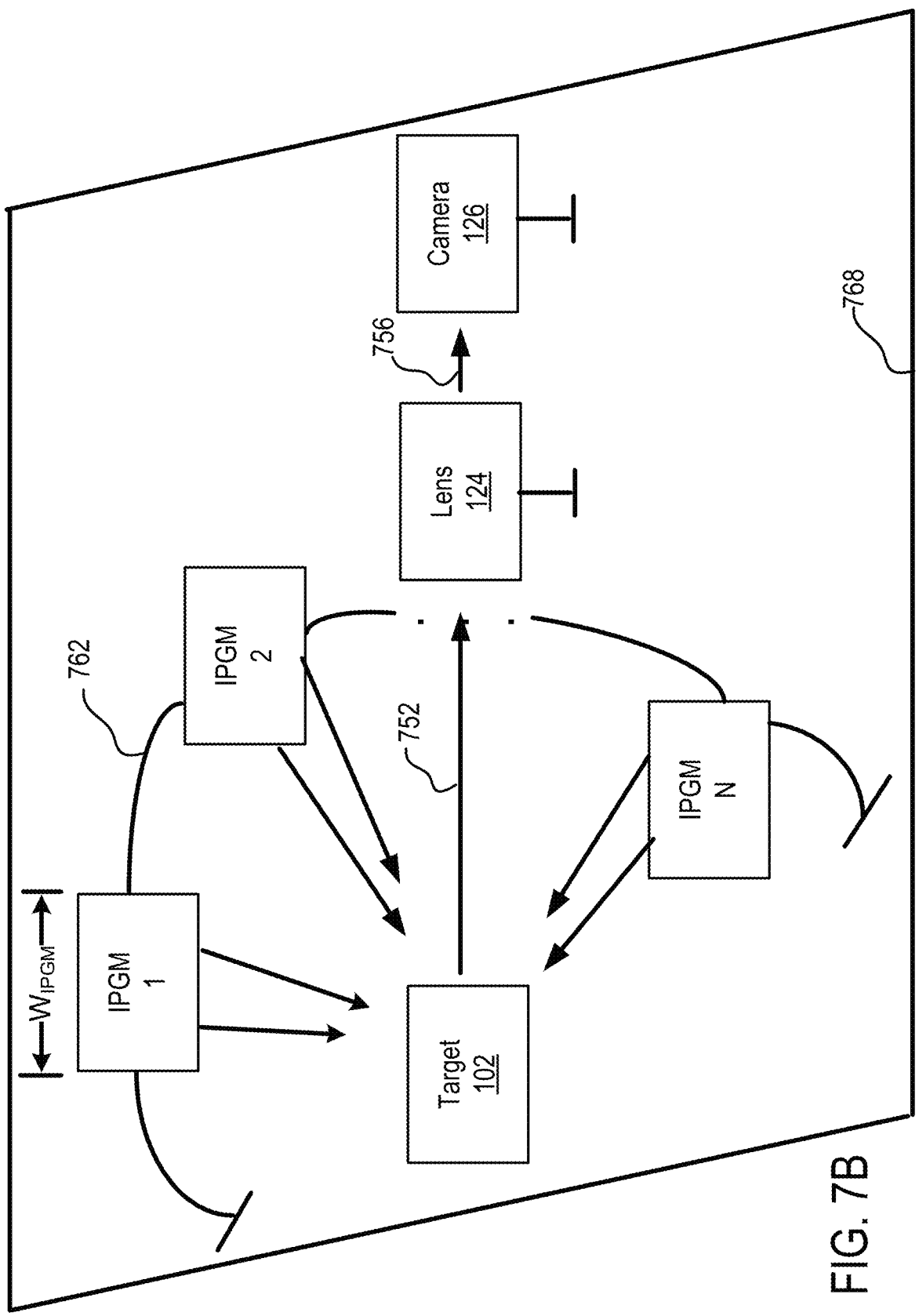
FIG. 7B illustrates the arrangement of the illumination pattern generation modules in a half-ring structure, according to one embodiment.

FIG. 7B illustrates the arrangement of the illumination pattern generation modules in a half ring structure according to one embodiment. Referring to FIG. 7B, multiple IPGMs (IPGM 1, IPGM 2, . . . , IPGM N) such as IPGMs 712, 713 (FIG. 7A) are arranged substantially symmetrically in a half-ring shape on a half-ring shaped, monolithic structure 762, to generate the selective excitation patterns. The half-ring structure 762 is fixed on the system table 768. In the embodiment of FIG. 7B, the N IPGMs generate N selective excitation patterns for SAO on the imaging target 102, and the scattered or fluoresced light 752 is passed through objective lens 124 and captured 756 by camera 126 which may be a CCD camera.

These arrangements of the IPGMs in the embodiment of FIG. 7B enable a monolithic and compact holding structure that has multiple benefits for enabling the SAO system to be used for DNA sequencing applications, compared to conventional optical-bench SAO systems where each optical component is individually mounted on its holding structure. The monolithic structure 762 enables the IPGM arrangement to be compact and symmetric, and this compact, symmetric, and monolithic structure preserves more stable channel-to-channel and beam-to-beam geometry against mechanical and thermal distortions. The compact monolithic structure 762 is also less susceptible to non-flatness or torsional and bending modes of the optical table 768, and the symmetric arrangement of the IPGMs around the half-ring structure 762 makes the effect of heat contraction or expansion less detrimental to the beam geometry, i.e., the channel-to-channel or beam-to-beam angles of laser beams are changed less compared to a non-symmetric structure. Furthermore, the compact design shortens the travel distances of the laser beam in air, making it easy to prevent air disturbances affecting the stability of the interference pattern that may cause the effective optical path length to change resulting in change of the interference fringe position. Such stability allows more accurate calibration of the beam geometry. Furthermore, the half-ring arrangement of the IPGMs in FIG. 7B has the additional advantage that it enables the imaging module (i.e., camera 126 and objective lens 124), illumination structure (i.e., the half-ring 762), and the imaging target 102 to be placed on one stiff structure (e.g., optical table) 768.

Figure 7C:
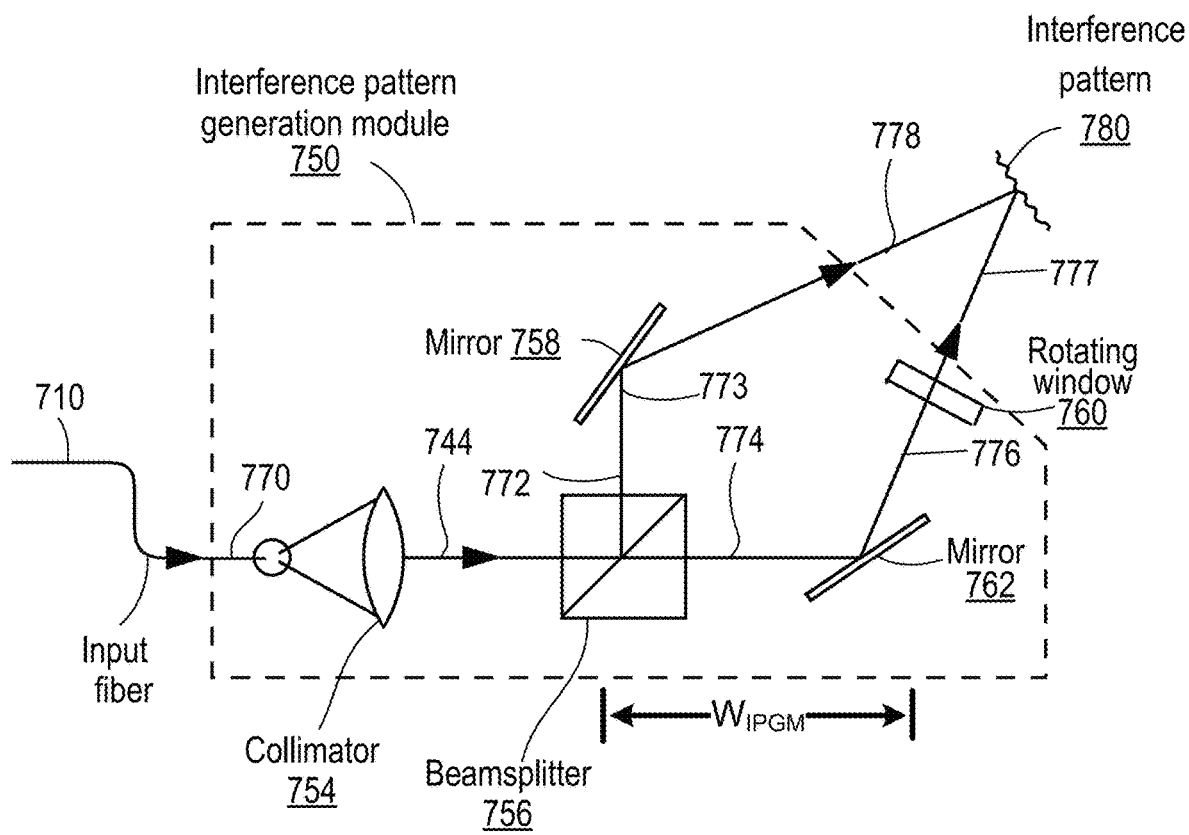
FIG. 7C illustrates the internal structure of an illumination pattern generation module, according to one embodiment.
Figure 7D:
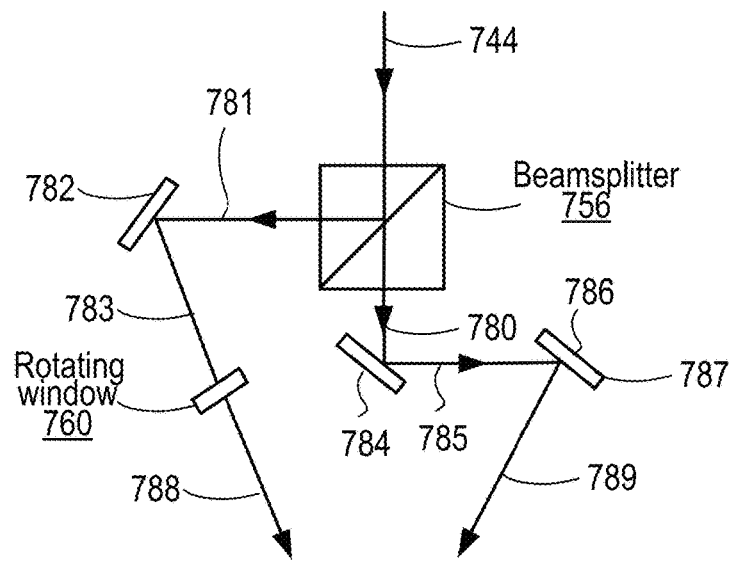
FIG. 7D illustrates the internal structure of an illumination pattern generation module, according to another embodiment.

FIG. 7C illustrates the internal structure of an illumination pattern generation module, according to one embodiment. The embodiment of FIG. 7C has a rotating window 760 in IPGM 750 that is placed after the mirror 762. The beam 770 from the optical fiber 710 is collimated by the collimating lens 754 and the collimated beam 744 is split into two beams 773, 774 by the beam splitter 756. Beam 773 is reflected by mirror 758 and the reflected beam 778 is projected onto the imaging target to generate the interference pattern 780. Beam 774 is reflected by mirror 762 and the optical path-length of the reflected beam 776 is modulated by optical window 760 that is rotated, using a galvanometer, thereby modulating the optical phase of the corresponding beam 776 and generating a modulated beam 777. The interference pattern 780 is generated in the region of overlap between the two laser beams 777, 778, with the pattern changed by varying the optical path-length of one of the beams 777. By placing the rotating window 760 after the mirror 762, the width $W_{IPGM}$ and the size of IPGM 750 can be reduced, as compared to the embodiment of FIG. 7A and FIG. 7D illustrated below. Thus, the half-ring shaped structure 762 holding the IPGMs can be made more compact, since the width $W_{IPGM}$ of the IPGM directly affects the radius of the half-ring, for example, as shown in FIG. 7B.

FIG. 7D illustrates the internal structure of an illumination pattern generation module, according to another embodiment. IPGMs in the embodiments of FIGS. 7A and 7C may produce two beams that do not have equal path length between the interfering point at the imaging target and the splitting point (i.e., the beam splitter). The non-equal path length may significantly reduce the sinusoidal contrast if a relatively short coherent-length laser is used and also limit the applicability of the SAO system to only a specific wavelength (e.g., 532 nm green laser) since only a small number of lasers with specific wavelengths have a sufficiently long coherent-length that can be used with such non-equal-path IPGMs for good sinusoidal contrast. Compared to the embodiment of FIG. 7A, the embodiment of FIG. 7D uses additional folding mirrors to achieve equal paths between the two split beams. The laser beam 744 is split into beams 781, 780 by beam splitter 756. Beam 781 is reflected by mirror 782 and its optical path-length is modulated by rotating window 760 to generate beam 788. On the other hand, beam 780 is reflected twice by two mirrors 784, 787 to generate the reflected beam 789. Beam 788 and 789 eventually interfere at the imaging target to generate the selective excitation patterns. By use of two mirrors 784, 786, the optical path 744-780-785-789 is configured to have a length substantially equal to the length of the optical path 781-783-788. This equal-path scheme allows lasers with short coherent lengths to be used to generate interference patterns with high contrast. Moreover, this equal-path scheme enables the SAO system to be used with wavelengths other than 532 nm, thus making multiple-color SAO practical.

Detection of Particles on Target Using Structured Illumination Patterns

Conventionally, a detection system estimates whether particles are present on a plurality of regions on a target by generating a set of reconstruction estimates based on the intensity values of the reconstructed image. For example, a reconstruction estimate for a pixel location of the reconstructed image may indicate whether a particle is present at a corresponding region of the target 102 by comparing the intensity value for the pixel location to a predetermined threshold. However, it is often difficult to detect particles with high accuracy in this manner due to, for example, the texture of the target that results in a noisy reconstruction image.

The particle detection method according to various embodiments of the present disclosure detects presence and location of particles on a target using measured signals from a plurality of structured illumination patterns. Specifically, the particle detection method disclosed herein uses measured signals obtained by illuminating the target with structured illumination patterns to detect particles. A particle may respond differently to illumination across multiple structured illumination patterns, and the degree of variation in these measured signals in raw images can provide significant insight for determining whether a particle is present on the target 102. While the reconstruction process generates a reconstructed image at a higher resolution than the raw images, the intensity values of the reconstructed image do not typically preserve this degree of variation that is useful for particle detection.

Figure 8:
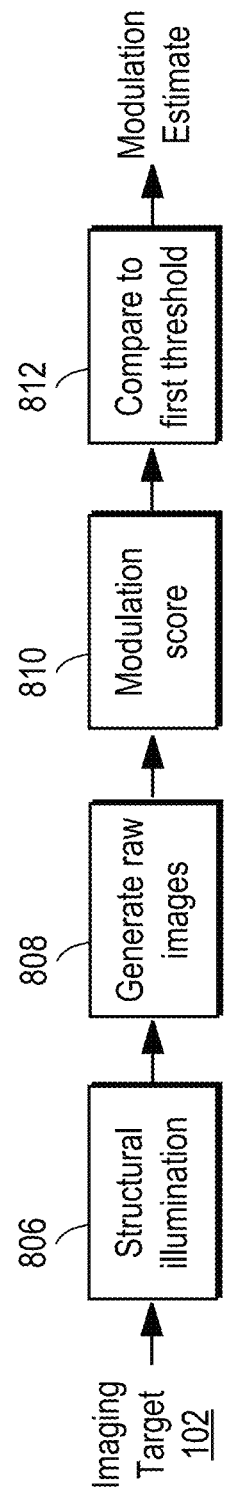
FIG. 8 illustrates a particle detection method, according to one embodiment.

Turning to the figures, FIG. 8 illustrates a particle detection method, according to one embodiment. The imaging target 102 is illuminated 806 with a plurality of structured illumination patterns that are each characterized by a set of illumination characteristics. In one embodiment, the structured illumination patterns are the selective excitation patterns described herein that are characterized by at least spatial frequency and phase. For example, the image target 102 may be illuminated with three structured illumination patterns that have a set of illumination characteristics {Spatial Frequency 1, Phase 1}, {Spatial Frequency 1, Phase 2}, and {Spatial Frequency 1, Phase 3}. The imaging target 102 may be assumed to be various biological molecules of interest such as DNA segments, mRNA (messenger RNA) segments, lncRNA (long no-coding RNA), or proteins that appear as spots or particles when fluorescently labeled and imaged, but is not limited hereto. The phase may be generated by varying the optical path-length of one of the laser beams used to generate the pattern, for example, by modulating the optical phase of the beam by use of a translating mirror. A plurality of raw images of the image target are generated 808 by measuring optical signals from the illuminated target 102. Each raw image may be obtained by illuminating the target 102 with a particular structured illumination pattern, and includes raw intensity values arranged as a set of pixels for the raw image. For example, a raw image may be generated when the image target 102 is illuminated with each of the three structured illumination patterns, resulting in three raw images Raw Image 1, Raw Image 2, and Raw Image 3. The raw intensity values may be captured by the optical imaging system 106 when the excited target 102 emits signals (or photons). Each pixel in a raw image may correspond to a particular region in the target 102, and the intensity value for the pixel location is obtained by measuring signals emitted from the particular region of the target 102 when the target 102 was illuminated with a structured illumination pattern.

For each region in one or more regions of the image target 102, a modulation estimate using the raw images are generated that indicates whether a particle is present at the region of the target 102. Specifically, a modulation score is determined 810 for each region of interest by combining a set of raw intensity values that correspond to the region of interest in the target 102. The set of raw intensity values are obtained from the plurality of raw images that were generated by imaging the target 102 with the plurality of structured illumination patterns. A particular region of the target 102 may have a corresponding pixel location in each raw image, and the modulation score for that particular region can be generated by combining each raw intensity value from the corresponding raw image together. For example, raw intensity values for a pixel location in Raw Image 1, Raw Image 2, and Raw Image 3 that correspond to the particular region of the target 102 may be combined to generate one modulation score for that region of the target 102. Alternatively, a modulation score can be determined for a region of the target 102 that encompasses more than a single pixel location. In this case, measurements from the region of the target 102 may have a group of corresponding pixel locations in each raw image, and the modulation score for that region can be generated by combining each group of raw intensity values from the corresponding raw image together.

The modulation score indicates a degree of variation in the set of raw intensity values, and predicts a likelihood that a particle is present on the region of the target 102 based on the observed raw intensity values. The modulation score is compared 812 to a first predetermined threshold to generate a modulation estimate indicating presence of the particle on the region of the target 102. Thus, each pixel location or a group of pixel locations in the raw images may be labeled with a modulation estimate indicating whether a particle or a part of a particle is present at the particular region of the target 102 corresponding to that pixel location. In one embodiment, a positive modulation estimate indicates that a particle is present on the target 102 if the modulation score is equal to or above the predetermined threshold. In general, a high modulation score indicates a higher likelihood of presence of a particle for that pixel. Typically, if a particle is not present in the corresponding location, the variation in pixel intensities according to changes in illumination characteristics such as phase changes, would be relatively small or constant. Thus, a high degree of variation indicates the presence of a particle in the location of the pixel.

Given a series of a set of raw intensity values for a particular region of the target 102, the modulation score indicates a degree of variation in the set of raw intensity values. In one instance, the modulation score is determined as the standard deviation between the set of raw intensity values. In another instance, the modulation score is determined as the standard deviation between the set of raw intensity values normalized (divided) by the mean of the set of raw intensity values. In another instance, the modulation score is determined as the range of the set of raw intensity values that indicates the difference between the maximum value and the minimum value of the set. In yet another instance, the modulation score is determined as a goodness-of-fit metric that indicates how well the set of raw intensity values fit to an expected curve when the particle is present at the region of the image target 102. For example, the goodness-of-fit may indicate how well the set of raw intensity values fir a sine curve of illumination phase vs. intensity. Moreover, it is appreciated that the modulation score may be generated by any transformation of these metrics as well, for example, scaling these metrics by a constant factor, addition or subtraction of certain terms, and the like.

In one embodiment, the modulation score for a particular region of the target 102 can also be generated by determining one or more sub-modulation scores from one or more subsets of raw images, and combining the sub-modulation scores to determine the modulation score for the region of the target 102, as will be described in more detail below in conjunction with Table 1.

Table 1 illustrates an example of determining modulation scores for a set of structured illumination patterns including K Spatial Frequencies and M Phases (therefore, N=K×M). In particular, Table 1 shows the case of K=4 Spatial Frequencies (Spatial Frequency 1, Spatial Frequency 2, Spatial Frequency 3, and Spatial Frequency 4) and M=3 Phases (Phase 1, Phase 2, and Phase 3), for a total of 12 structured illumination patterns. While the example in Table 1 uses the same number of phases for all spatial frequencies, this is merely an example, and different number of phases can be used for each different spatial frequency in other instances.

In Table 1, modulation scores for a particular region of interest of the target 102 that corresponds to a single pixel location in each raw image are determined using raw intensity values from these pixel locations. Thus, the particular region of the target 102 is associated with 12 raw pixel intensity values, each obtained from a raw image generated by illuminating the target 102 with a corresponding structured illumination pattern. In this example, four modulation scores, MS1, MS2, MS3, and MS4, are determined for this particular region of the target 102. Each modulation score is determined by combining the raw pixel intensity values that are obtained from a subset of raw images with same spatial frequency. For example, "IS1" represents raw pixel intensity values for the region of the image target 102 obtained by illuminating the image target 102 with structured illumination patterns {Spatial Frequency 1, Phase 1}, {Spatial Frequency 1, Phase 2}, {Spatial Frequency 1, Phase 3}, "IS2" represents raw pixel intensity values obtained by illuminating the image target 102 with structured illumination patterns {Spatial Frequency 2, Phase 1}, {Spatial Frequency 2, Phase 2}, {Spatial Frequency 2, Phase 3}, "IS3" represents raw pixel intensity values obtained by illuminating the image target 102 with structured illumination patterns {Spatial Frequency 3, Phase 1}, {Spatial Frequency 3, Phase 2}, {Spatial Frequency 3, Phase 3}, and "IS4" represents raw pixel intensity values obtained by illuminating the image target 102 with structured illumination patterns {Spatial Frequency 4, Phase 1}, {Spatial Frequency 4, Phase 2}, {Spatial Frequency 4, Phase 3}. "MS1" represents the modulation score for subset IS1, "MS2" represents the modulation score for subset IS2, "MS3" represents the modulation score for subset IS3, and "MS4" represents the modulation score for subset IS4. As described above, each modulation score may be determined by one or a combination of taking the standard deviation, normalizing the standard deviation by the mean, the range, and a goodness-of-fit metric for the corresponding subset of raw intensity values, among other ways to determine degree of variation. In addition, the modulation scores for a particular region of the target 102 may also be generated by combining a group of pixel intensity values from each raw image.

In one instance, modulation scores for individual subsets can be used to generate the modulation estimate of whether a particle is present at the particular region of the image target 102. For example, a detection system may use only modulation score MS1 to determine the presence of a particle by comparing the score to a predetermined threshold. In this example, the modulation estimate may indicate a particle is present if modulation score MS1 is equal to or above a threshold, or may indicate a particle is not present if MS1 is below the threshold. In another instance, two or more of the scores MS1, MS2, MS3, and MS4 can be considered as sub-modulation scores, and these sub-modulation scores are combined to generate a final modulation score for the region of the image target 102. For example, the final modulation score "MS" can be determined as the multiplication of all four sub-modulation scores MS1×MS2×MS3×MS4, and the detection system may use the final score MS to determine the presence of a particle by comparing the final score to a predetermined threshold. Similarly, the modulation estimate may indicate a particle is present if the final modulation score MS is equal to or above a threshold, or may indicate a particle is not present if MS is below the threshold. Although multiplication is used as an example, other operations may be used in other embodiments to combine sub-modulation scores, such as addition, multiplication, and the like.

TABLE 1

| | | Spatial Frequency (K = 4) | | | |
|---|---|---|---|---|---|
| | | 1 | 2 | 3 | 4 |
| Position (M = 3) | 1 | IS1 | IS2 | IS3 | IS4 |
| | 2 | | | | |
| | 3 | | | | |
| Modulation Score (MS) | | 1. MS1 = Standard Deviation (IS1) | 1. MS2 = Standard Deviation (IS2) | 1. MS3 = Standard Deviation (IS3) | 1. MS4 = Standard Deviation (IS4) |
| | | 2. MS1 = Max (IS1) − Min (IS1) | 2. MS2 = Max (IS2) − Min (IS2) | 2. MS3 = Max (IS3) − Min (IS3) | 2. MS4 = Max (IS4) − Min (IS4) |
| | | 3. MS1 = Goodness of fit between IS1 and the structured illumination | 3. MS2 = Goodness of fit between IS2 and the structured illumination | 3. MS3 = Goodness of fit between IS3 and the structured illumination | 3. MS4 = Goodness of fit between IS4 and the structured illumination |
| | | 4. MS1 = Standard Deviation (IS1)/Mean (IS1) | 4. MS2 = Standard Deviation (IS2)/Mean (IS2) | 4. MS3 = Standard Deviation (IS3)/Mean (IS3) | 4. MS4 = Standard Deviation (IS4)/Mean (IS4) |

Figure 9:
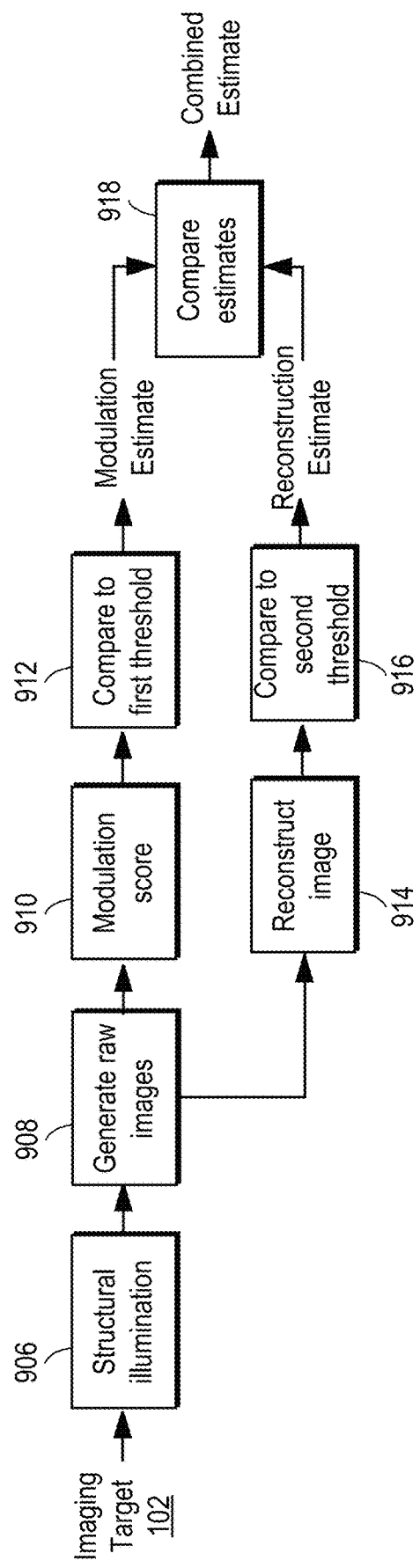
FIG. 9 illustrates a particle detection method, according to another embodiment.

IS: Series of Intensities of a pixel that represent measurements from a particular region of interest on the target Turning to the figures, FIG. 9 illustrates a particle detection method, according to another embodiment. In this embodiment, modulation estimates are used to validate reconstruction estimates obtained from reconstructed images to generate a set of combined estimates for particle detection on a plurality of regions of the target 102. The reconstruction estimates are compared to modulation estimates, and are used to validate the reconstruction estimates. Specifically, while reconstruction estimates may not have the optimal accuracy, reconstructed images can provide particle detection estimates at a higher granularity of regions than raw images if they have a higher image resolution compared to the plurality of raw images. For example, a reconstructed image may have 2 times the resolution of the plurality of raw images, and the reconstruction estimate for 1 pixel location in the reconstructed image may correspond to a smaller area of the target 102 than the modulation estimate for 1 pixel location in the plurality of raw images. By validating the reconstruction estimates with modulation estimates of higher accuracy, the detection system can perform particle detection with both higher accuracy and with higher granularity.

Returning to FIG. 9, modulation estimates are generated using a plurality of raw images through steps 906, 908, 910, and 912, which are largely identical to steps 806, 808, 810, and 812 described in conjunction with FIG. 8. A reconstructed image of the target 102 is generated by reconstructing 914 the plurality of raw images. In one embodiment, when the plurality of raw images is generated by a plurality of selective excitation patterns, the reconstruction process is the SAO reconstruction process or post-processing step described herein in conjunction with FIGS. 1A-1C and 6A-6C that generates a high spatial resolution reconstructed image. A set of reconstruction estimates are generated for pixel locations of the reconstructed image by comparing 916 the intensity values of the reconstructed image to a predetermined threshold. For example, a reconstruction estimate may be generated for each pixel location of the reconstructed image, and a positive estimate may indicate a particle is present at a corresponding region of the target 102 if the intensity value for the pixel location is equal to or above a threshold. The reconstruction estimate for a particular region of the target 102 is compared 918 to the modulation estimate for the particular region of the target 102 to generate a combined estimate for the target 102. When the resolution of the reconstructed image is higher than the resolution of the raw images, and the reconstructed image captures the target 102 with higher granularity, a pixel in a reconstructed image may correspond to an area on the target 102 that is smaller than an area imaged by a pixel in a raw image. In this instance, a reconstruction estimate for a pixel in the reconstructed image may be compared to a modulation estimate for a region of the target 102 that encompasses or otherwise overlaps the region encompassed by the reconstructed pixel.

In one embodiment, the modulation estimates are used to decrease false positive errors for reconstruction estimates. A false positive error occurs when a particle is not present in a particular region of the target 102, but the reconstruction estimate indicates that a particle is present in that region. These errors may occur due to noisy background images in of the target 102 that include defects or other patterns that appear to look like the particles of interest when in fact they are not. To decrease false positive errors, the detection system identifies reconstructed pixels with positive reconstruction estimates, compares 918 these estimates to the corresponding modulation estimates, and generates combined estimates as the final estimates for particle detection. A combined estimate for a reconstructed pixel with a positive reconstruction estimate indicates that a particle is present only if the corresponding modulation estimate is positive, and indicates that a particle is not present if the corresponding modulation estimate is negative. In this manner, the modulation estimates can be used to validate positive reconstruction estimates in case they mistakenly detect background patterns of the target 102 as the particles of interest.

In another embodiment, the modulation estimates can also be used to decrease false negative errors for reconstruction estimates. A false negative error occurs when a particle is present in a particular region of the target 102, but the reconstruction estimate indicates that a particle is not present in that region. To decrease false negative errors, the detection system identifies reconstructed pixels with negative reconstruction estimates, compares these estimates to the corresponding modulation estimates, and generates combined estimates as the final estimates for particle detection. A combined estimate for a reconstructed pixel with a negative reconstruction estimate indicates that a particle is not present only if the corresponding modulation estimate is negative, and indicates that a particle is present if the corresponding modulation estimate is positive.

Methods and apparatus for obtaining images of the biological molecules and samples are described in further detail in U.S. patent application Ser. No. 15/059,245 filed on Mar. 2, 2016, now issued as U.S. Pat. No. 9,772,505, which is incorporated by reference.

Examples of Particle Detection

Figure 10:
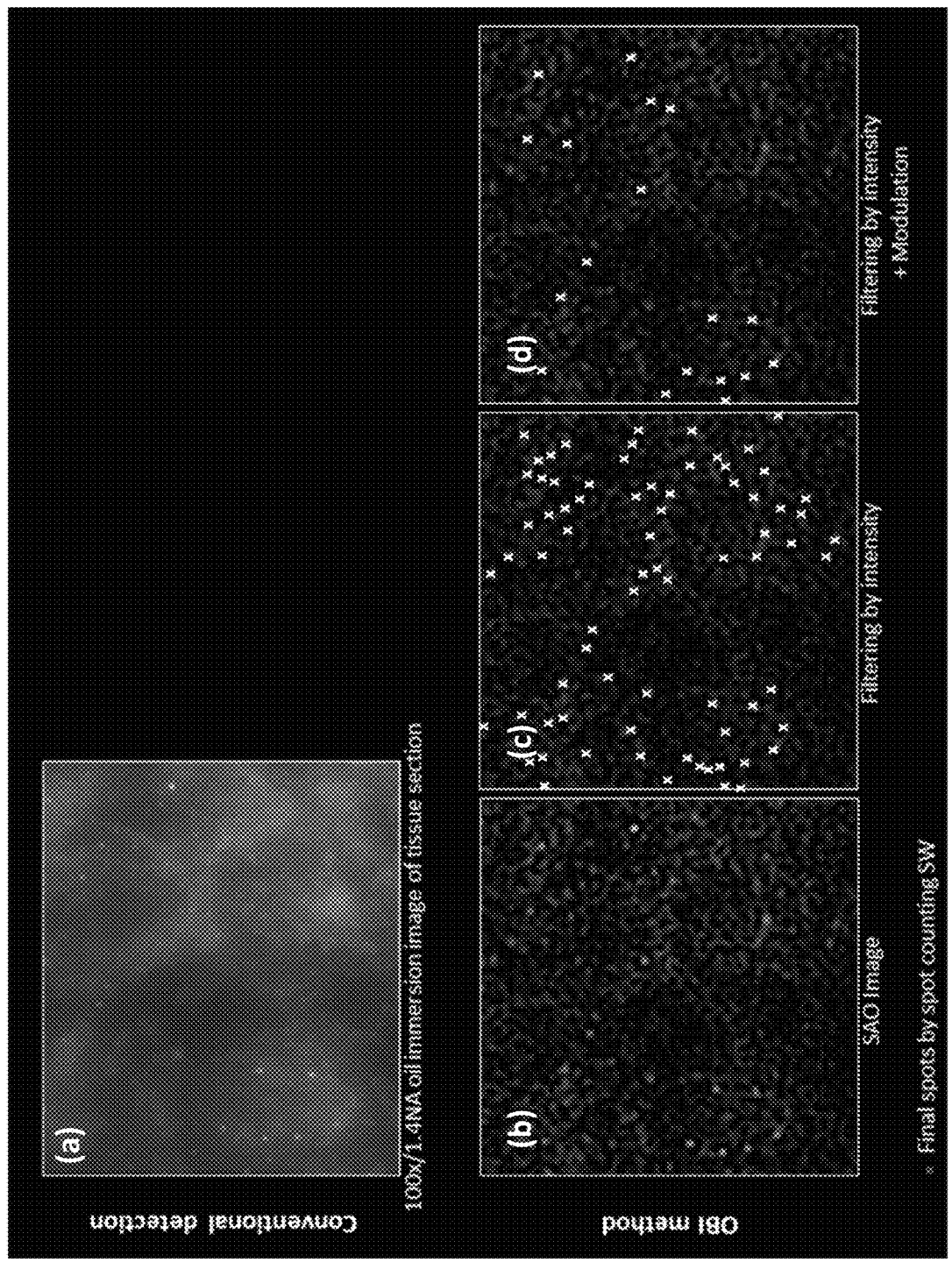
FIG. 10 illustrates examples of particle detection methods that were performed on a tissue section target area, according to one embodiment.

FIG. 10 illustrates examples of particle detection methods that were performed on a tissue section target area, according to one embodiment. Part (a) of FIG. 10 illustrates an image of the tissue section obtained by a conventional high resolution microscopy with oil immersion lens (100×/1.4 NA objective lens with z-stack). As shown in Part (a) of FIG. 10, the particles of interest (mRNA molecules) are shown as white spots across the tissue section. Part (b) of FIG. 10 illustrates a reconstructed image of the target area obtained by performing a SAO reconstruction process on raw images. The raw images were obtained by illuminating the target area with a series of 12 distinct structured illumination patterns formed by the interference of laser beams. As shown in Part (b) of FIG. 10, the particles appear as white spots on the image. Part (c) of FIG. 10 illustrates the image of Part (b) of FIG. 10 annotated (in "x" marks) with regions that are associated with positive reconstruction estimates, specifically pixels that have intensity values above a threshold, as described in conjunction with the method of FIG. 9. As shown in Part (c) of FIG. 10, more annotations appear than are particles on the target area, due to false positive errors. Part (d) of FIG. 10 illustrates the image of Part (b) of FIG. 10 annotated (in "x" marks) with regions that are associated with positive combined estimates, which are generated by comparing the annotated regions in Part (c) of FIG. 10 with the corresponding modulation estimates, and retaining annotations for only those regions that have positive modulation estimates, as described in conjunction with the method of FIG. 9. The modulation estimates were generated by determining 4 sub-modulation scores MS1, MS2, MS3, MS4 each respectively for raw intensity values from a subset of raw images with same spatial frequency as illustrated in Table 1, and determining the final modulation score as MS=MS1×MS2×MS3×MS4. Each sub-modulation score was determined as the standard deviation normalized by the mean of the subset of raw intensity values. As shown in Part (d) of FIG. 10, the detection system is able to detect the particles with improved accuracy and with a lower false positive error rate by validating the reconstruction estimates with modulation estimates.

Figure 11:
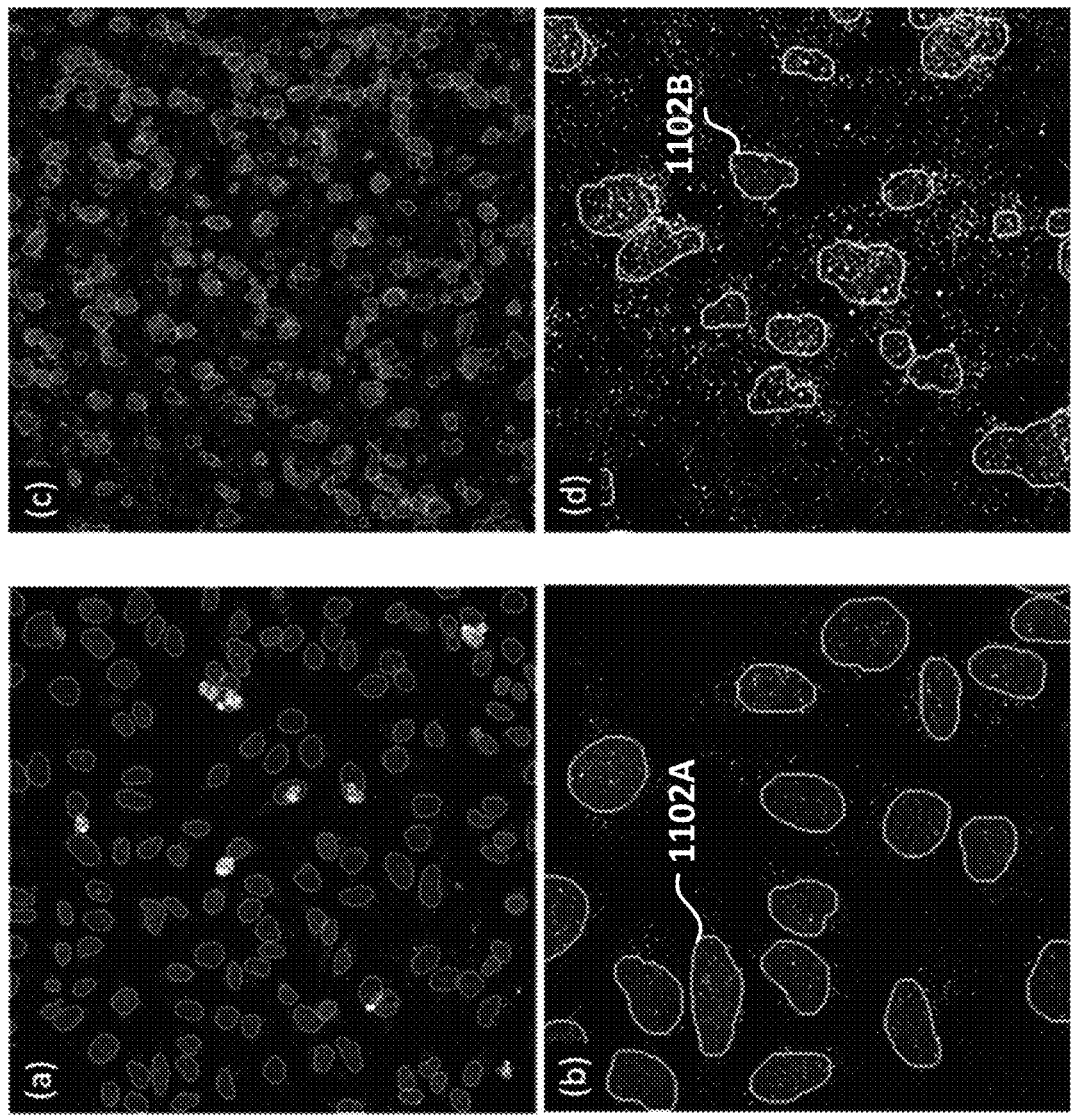
FIG. 11 illustrates examples of particle detection methods that were performed on single molecule mRNA FISH (fluorescence in situ hybridization) samples, according to one embodiment.

FIG. 11 illustrates examples of particle detection methods that were performed on single molecule mRNA FISH (fluorescence in situ hybridization) samples, according to one embodiment. Part (a) of FIG. 11 illustrates a first annotated image of U2OS cells on a 96 well plate labeled for EGFR (Epidermal Growth Factor Receptor) mRNA by performing the particle detection method of FIG. 9 to reduce false positive error rates. Labeling of mRNA was done by Stellaris® mRNA FISH method using probes conjugated with Quasor® 670 dye, both of LGC Biosearch Technologies. The image shown corresponds to one field of view (0.33 mm×0.33 mm) of an SAO apparatus according to the embodiments described herein. In this example, total of 146 cells and 3,492 mRNA spots were detected from one field of view. Part (b) of FIG. 11 illustrates a zoomed-in view of the image in Section (a) of FIG. 11. Detected mRNA's are shown as individual dots, and the line, as illustrated as an example as 1102A, shows the boundary of nucleus detected by nuclear segmentation software. Part (c) of FIG. 11 illustrates a second annotated image of a region from mouse brain tissue labeled for mRNA using probes conjugated with Cy5 dye. Name of the gene target and specific chemistry method for labeling mRNA is not known. The image shown corresponds to one field of view (0.33 mm×0.33 mm) of an SAO apparatus according to the embodiments herein. In this example, total of 275 cells and 36,346 mRNA spots were detected from one field of view, as illustrated as an example as 1102B. Part (d) of FIG. 11 illustrates a zoomed-in view of the image in Part (c) of FIG. 11. Compared to the cultured cells, the mouse brain tissue shows significantly higher density of cells and mRNA spots. Furthermore, background signal inherent in the tissue makes imaging and spot detection relatively more challenging compared to the cultured cells. Table 2 summarizes the results of Parts (a), (b), (c), and (d) of FIG. 11. The example illustrated in FIG. 11 shows that the particle detection method described in conjunction with FIGS. 8-9 is capable of detecting presence of mRNA segments in tissue samples or well plates.

TABLE 2

Comparison of spot counting results for two different types of single molecule mRNA FISH samples

| Sample type | U2OS cells on a 96 well plate | Mouse brain tissue |
| --- | --- | --- |
| Gene target | EGFR | N/A |
| Fluorescent dye | Q670 | Cy5 |
| # of cells per FOV | 146 | 275 |
| # of spots per FOV | 3,492 | 36,341 |
| Average # of spots per cell | 24 | 132 |
| Computation time | 60 sec | 198 sec |

Upon reading this disclosure, those of skill in the art will appreciate still additional alternative structural and functional designs for a method and an apparatus for synthetic aperture optics. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A method for detecting particles on a target, the method comprising the steps of:
for a region of the target, illuminating the target with a plurality of structured illumination patterns to generate a first series of raw intensity values for the region of the target, each structured illumination pattern characterized by a spatial frequency and an illumination phase, wherein each raw intensity value in the first series of raw intensity values is obtained by measuring a corresponding optical signal from the region of the target illuminated with a corresponding structured illumination pattern;
generating a first estimate that indicates whether a particle is present at the region of the target from the first series of raw intensity values;
for another region of the target, illuminating the target with the plurality of structured illumination patterns to generate a second series of raw intensity values for the another region of the target, wherein each raw intensity value in the second series of raw intensity values is obtained by measuring a corresponding optical signal from the another region of the target illuminated with a corresponding structured illumination pattern; and
generating a second estimate that indicates whether the particle or another particle is present at the another region of the target from the second series of raw intensity values.

2. The method of claim 1, further comprising:
after generating the first estimate, for the region of the target, illuminating the target with the plurality of structured illumination patterns to generate a third series of raw intensity values for the region of the target, wherein each raw intensity value in the third series of raw intensity values is obtained by measuring a corresponding optical signal from the region of the target illuminated with a corresponding structured illumination pattern; and
generating a third estimate that indicates whether the particle is present at the region of the target from the third series of raw intensity values.

3. The method of claim 1, wherein generating the first estimate comprises:
determining a first modulation score indicating a degree of variation in the first series of raw intensity values; and
generating the first estimate for the region of the target by comparing the first modulation score to a predetermined threshold.

4. The method of claim 3, wherein determining the first modulation score comprises calculating a variance of two or more of the first series of raw intensity values, calculating a range of two or more of the first series of raw intensity values, calculating the variance of two or more of the first series of raw intensity values normalized by a mean of the two or more of the first series of raw intensity values, or a goodness-of-fit metric to a reference curve of two or more of the first series of raw intensity values.

5. The method of claim 3, wherein determining the first modulation score comprises:
determining a set of sub-modulation scores, each sub-modulation score determined by combining a respective subset of the first series of raw intensity values; and
combining the set of sub-modulation scores to determine the first modulation score.

6. The method of claim 5, wherein the respective subset of the first series of raw intensity values are obtained by illuminating the region of the target with a corresponding subset of the plurality of structured illumination patterns having a same spatial frequency.

7. The method of claim 1, wherein the plurality of structured illumination patterns are selective excitation patterns.

8. The method of claim 1, wherein the particle is a biological molecule including at least one of DNA segments, mRNA segments, or lncRNA.

9. The method of claim 1, further comprising:
generating a reconstructed image by processing at least the first series of raw intensity values, the reconstructed image including a set of reconstructed intensity values obtained from processing the at least the first series of raw intensity values;
for the region of the target, determining a third estimate that indicates whether the particle is present at the region of the target based on one or more reconstructed intensity values corresponding to the region of the target; and
generating a combined estimate for the region of the target by comparing the first estimate to the third estimate.

10. The method of claim 1, further comprising responsive to determining that the particle is present at the region of the target based on the first estimate, determining that the same particle is present at the another region of the target based on the second estimate.

11. The method of claim 1, wherein the detection module is further configured to:
responsive to determining that the particle is present at the region of the target based on the first estimate, determine that the same particle is present at the another region of the target based on the second estimate.

12. A system for detecting particles on a target, the system comprising:
a plurality of illumination modules configured to illuminate a region of the target with a plurality of structured illumination patterns that are each characterized by a spatial frequency and an illumination phase, and at a later time, illuminate another region of the target with the plurality of structured illumination patterns,
an optical imaging module configured to generate a first series of raw intensity values for the region of the target, wherein each raw intensity value in the first series of raw intensity values is obtained by measuring a corresponding optical signal from the region of the target illuminated with a corresponding structured illumination pattern, and generate a second series of raw intensity values for the another region of the target, wherein each raw intensity value in the second series of raw intensity values is obtained by measuring a corresponding optical signal from the another region of the target illuminated with a corresponding structured illumination pattern; and
a detection module configured to generate, for the region of the target, a first estimate that indicates whether a particle is present at the region of the target from the first series of raw intensity values, and generate, for the another region of the target, a second estimate that indicates whether the particle or another particle is present at the another region of the target from the second series of raw intensity values.

13. The system of claim 12,
wherein the plurality of illumination modules is further configured to:
after generating the first estimate, for the region of the target, illuminate the target with the plurality of structured illumination patterns to generate a third series of raw intensity values for the region of the target, wherein each raw intensity value in the third series of raw intensity values is obtained by measuring a corresponding optical signal from the region of the target illuminated with a corresponding structured illumination pattern, and wherein the detection module is further configured to:

generate a third estimate that indicates whether the particle is present at the region of the target from the third series of raw intensity values.

14. The system of claim 12, wherein the detection module is further configured to:

determine a first modulation score indicating a degree of variation in the first series of raw intensity values; and generate the first estimate for the region of the target by comparing the first modulation score to a predetermined threshold.

15. The system of claim 14, wherein the first modulation score is determined by calculating a variance of two or more of the first series of raw intensity values, calculating a range of two or more of the first series of raw intensity values, calculating the variance of two or more of the first series of raw intensity values normalized by a mean of the two or more of the first series of raw intensity values, or a goodness-of-fit metric to a reference curve of two or more of the first series of raw intensity values.

16. The system of claim 14, wherein the detection module is further configured to:

determine a set of sub-modulation scores, each sub-modulation score determined by combining a respective subset of the first series of raw intensity values; and combine the set of sub-modulation scores to determine the first modulation score.

17. The system of claim 16, wherein the respective subset of the first series of raw intensity values are obtained by illuminating the region of the target with a corresponding subset of the plurality of structured illumination patterns having a same spatial frequency.

18. The system of claim 12, wherein the plurality of structured illumination patterns are selective excitation patterns.

19. The system of claim 12, wherein the particle is a biological molecule including at least one of DNA segments, mRNA segments, or lncRNA.

20. The system of claim 12, further comprising:

a reconstruction module configured to generate a reconstructed image by processing at least the first series of raw intensity values, the reconstructed image including a set of reconstructed intensity values obtained from processing the at least the first series of raw intensity values, and wherein the detection module is further configured to:

for the region of the target, determine a third estimate that indicates whether the particle is present at the region of the target based on one or more reconstructed intensity values corresponding to the region of the target; and generate a combined estimate for the region of the target by comparing the first estimate to the third estimate.

* * * * *